US009497887B2

United States Patent
Matsumoto et al.

(10) Patent No.: US 9,497,887 B2
(45) Date of Patent: Nov. 15, 2016

(54) COOLING STRUCTURE FOR HEATING ELEMENT AND POWER CONVERTER

(71) Applicant: HITACHI, LTD., Tokyo (JP)

(72) Inventors: Daisuke Matsumoto, Tokyo (JP); Yuuichi Mabuchi, Tokyo (JP); Akira Mima, Tokyo (JP); Tetsuya Kawashima, Tokyo (JP); Yukio Hattori, Tokyo (JP); Hiroshi Kamizuma, Tokyo (JP);
(Continued)

(73) Assignee: HITACHI, LTD., Tokyo (JP)

( * ) Notice: Subject to any disclaimer, the term of this patent is extended or adjusted under 35 U.S.C. 154(b) by 3 days.

(21) Appl. No.: 14/568,300

(22) Filed: Dec. 12, 2014

(65) Prior Publication Data

US 2015/0250074 A1 Sep. 3, 2015

(30) Foreign Application Priority Data

Dec. 13, 2013 (JP) .................................. 2013-257945
Sep. 29, 2014 (JP) .................................. 2014-198049

(51) Int. Cl.
*H05K 7/20* (2006.01)
*H01L 23/473* (2006.01)

(52) U.S. Cl.
CPC ...... *H05K 7/20154* (2013.01); *H05K 7/20336* (2013.01); *H05K 7/20409* (2013.01); *H05K 7/20936* (2013.01)

(58) Field of Classification Search
CPC .............................. G06F 1/181–1/182; H05K 7/20218–7/20381; H05K
(Continued)

(56) References Cited

U.S. PATENT DOCUMENTS 8,897,011 B2 * 11/2014 Kwak .................. H01L 23/473
165/80.4
9,003,649 B1 * 4/2015 Romero ............... B23K 20/122
29/830
(Continued)

FOREIGN PATENT DOCUMENTS

EP 0 771 138 A1 5/1997
GB 1 247 927 A 9/1971
(Continued)

OTHER PUBLICATIONS

Extended European Search Report, mailed Jul. 16, 2015, which issued during the prosecution of European Patent Application No. 14197340.4, which corresponds to the present application.

*Primary Examiner* — Anthony Haughton
*Assistant Examiner* — Razmeen Gafur
(74) *Attorney, Agent, or Firm* — Baker Botts L.L.P.

(57) ABSTRACT

A cooling structure is provided. The cooling structure includes cooling surfaces on two confronting side surfaces; a plurality of double-sided-cooling power module, the heat receiving block pinching the heating elements arranged in a vertical direction on the confronting side surfaces, first and second cooling devices, each including the heat radiating fins, disposed above the heating elements, extending in a horizontal direction, and a pressure contacting part configured to contact the heating elements and the receiving block with a pressure force. The heat radiation fins are blown from a side of the electric terminal.

22 Claims, 38 Drawing Sheets

(72) Inventors: Ryouhei Miyagawa, Tokyo (JP);
Tomonori Ichikawa, Tokyo (JP)

(58) Field of Classification Search
CPC ............................. 7/20409–7/20418;H05K
7/20009–7/202; H01L
23/367–23/3677; H01L 23/473;
H01L 23/46–23/467
USPC ............... 361/676–678, 679.46–679.54,
361/688–723; 165/80.1–80.5, 104.33, 185;
174/15.1–15.3, 16.1–16.3, 547, 548;
257/712–722, E23.088; 24/453,
24/458–459; 454/184; 312/236
See application file for complete search history.

(56) References Cited

U.S. PATENT DOCUMENTS

| | | | | |
|---|---|---|---|---|
| 2002/0131237 A1* | 9/2002 | Snyder | .............. | F28D 15/0233 361/719 |
| 2004/0109293 A1* | 6/2004 | Apfelbacher | ........ | H01H 50/021 361/709 |
| 2005/0135065 A1* | 6/2005 | Nakatsu | .............. | H01L 23/4006 361/703 |
| 2005/0207134 A1* | 9/2005 | Belady | .................... | H05K 1/14 361/796 |
| 2006/0007656 A1* | 1/2006 | Symons | ................ | H01L 23/473 361/699 |
| 2006/0007720 A1* | 1/2006 | Pfeifer | ............... | H05K 7/20927 363/141 |
| 2006/0018100 A1* | 1/2006 | Guo | ........................ | H01L 24/49 361/719 |
| 2006/0120047 A1* | 6/2006 | Inoue | ................. | H01L 23/4006 361/699 |
| 2007/0053154 A1* | 3/2007 | Fukuda | ............... | G11B 33/022 361/679.33 |
| 2007/0064396 A1* | 3/2007 | Oman | ................... | H01L 23/427 361/700 |
| 2008/0074846 A1* | 3/2008 | Peng | ................. | H05K 7/20936 361/715 |
| 2008/0158824 A1* | 7/2008 | Aoki | ....................... | H01L 23/24 361/711 |
| 2009/0129024 A1* | 5/2009 | Mahoney | ........... | H01L 23/4006 361/709 |
| 2010/0290490 A1* | 11/2010 | Hammel | ............ | H01L 23/3735 372/36 |
| 2011/0057713 A1* | 3/2011 | Kawanami | ........... | H01L 23/642 327/427 |
| 2011/0080711 A1* | 4/2011 | Yesin | .................... | H01L 23/427 361/700 |
| 2011/0134609 A1* | 6/2011 | Folts | .................... | H01L 23/4006 361/717 |
| 2011/0199736 A1* | 8/2011 | Sawada | ............. | H05K 7/20909 361/722 |
| 2011/0216507 A1* | 9/2011 | Kadomoto | ............... | H05K 7/20 361/714 |
| 2011/0317368 A1* | 12/2011 | Pautsch | ................ | H01L 23/473 361/702 |
| 2012/0008282 A1* | 1/2012 | Ide | ..................... | H01L 23/4334 361/702 |
| 2012/0162912 A1* | 6/2012 | Kim | .................. | H05K 7/20909 361/692 |
| 2012/0229984 A1* | 9/2012 | Guo | ....................... | H05K 7/209 361/704 |

FOREIGN PATENT DOCUMENTS

| | | |
|---|---|---|
| JP | 2000-60106 A | 2/2000 |
| JP | 2006-108239 A | 4/2006 |
| JP | 2013-73964 A | 4/2013 |

\* cited by examiner

FIG.14A
FIG.14B
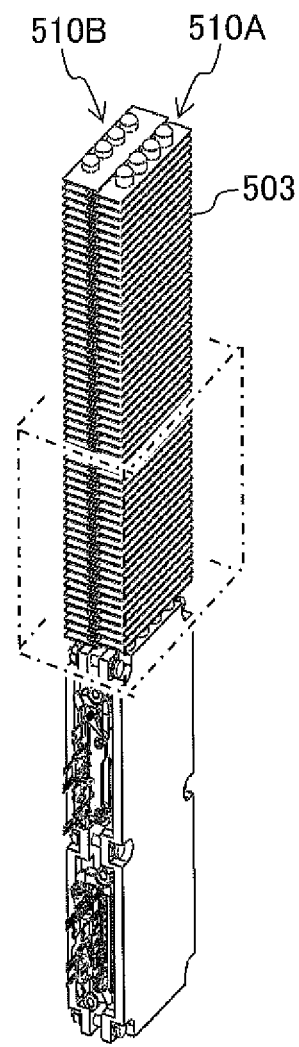
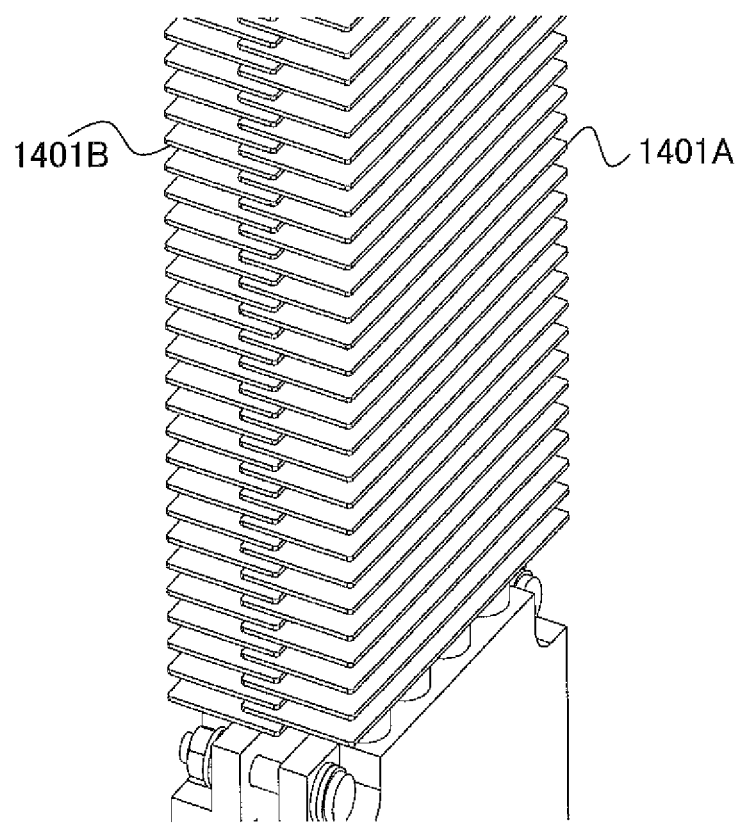

FIG.15A
FIG.15B
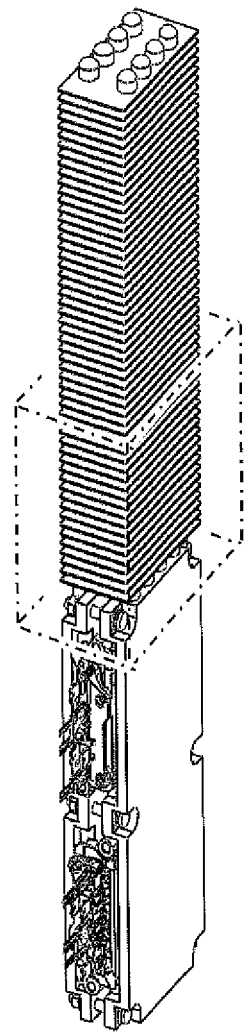
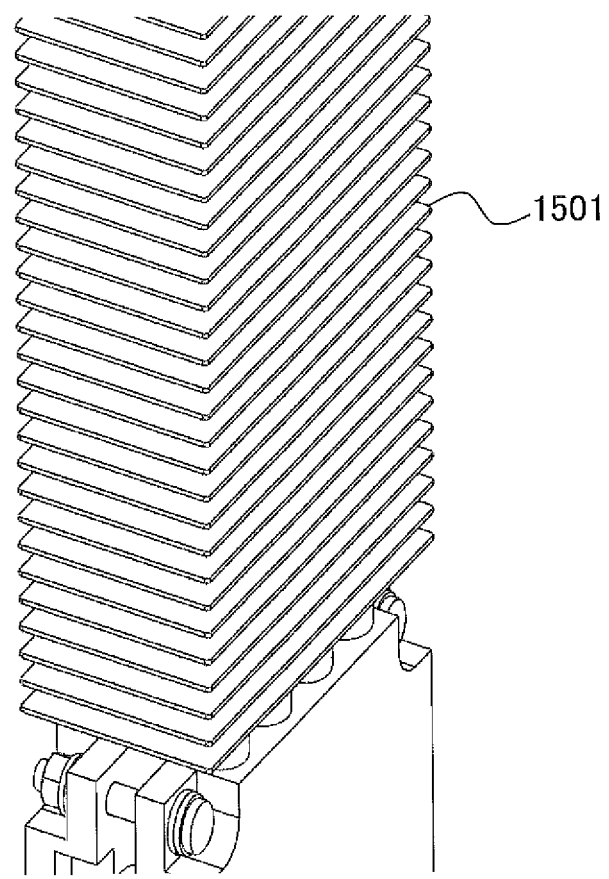

FIG.16A
FIG.16B
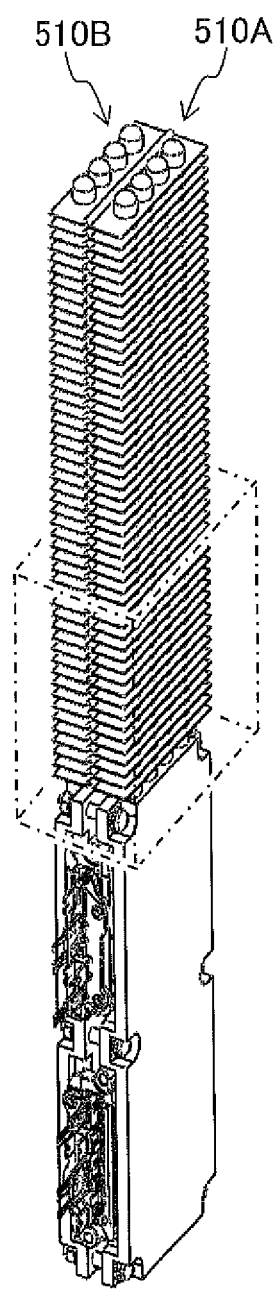
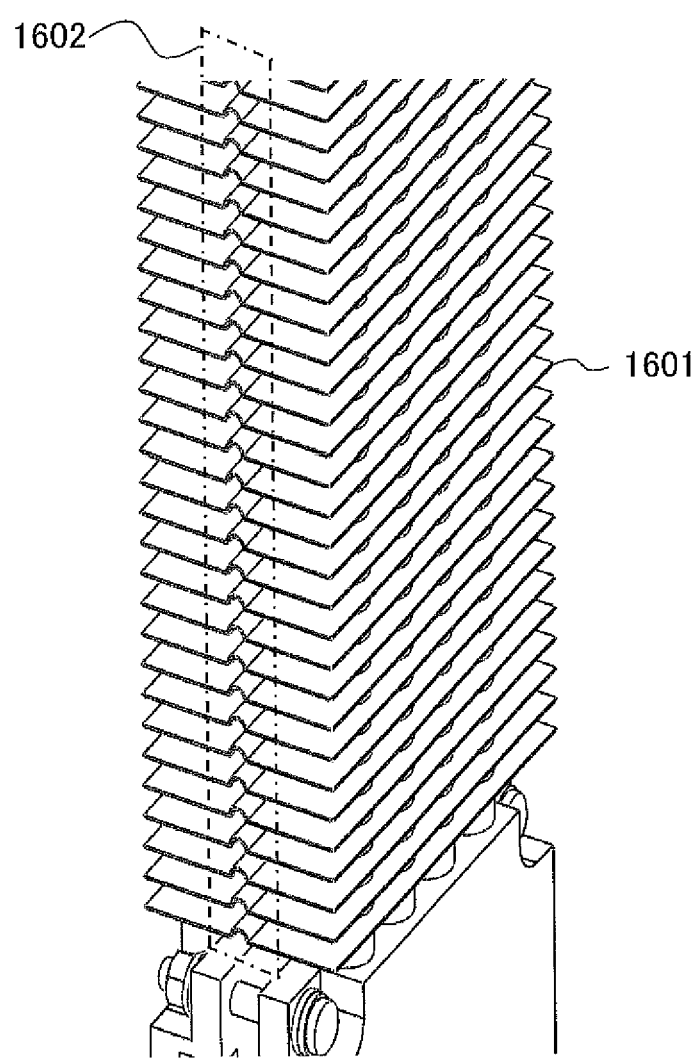

US 9,497,887 B2

COOLING STRUCTURE FOR HEATING ELEMENT AND POWER CONVERTER

CROSS REFERENCE TO RELATED APPLICATION

This application claims the foreign priority benefit under Title 35, United States Code, §119(a)-(d) of Japanese Patent Application No. 2013-257945, filed on Dec. 13, 2013 in the Japan Patent Office and Japanese Patent Application No. 2014-198049, filed on Sep. 29, 2014 in the Japan Patent Office, the disclosures of which are herein incorporated by reference in their entirety.

BACKGROUND OF THE INVENTION

1. Field of the Invention

The present invention relates to a cooling structure for a heating element and a power converter.

2. Description of the Related Art

A power converter includes a circuit using semiconductor devices for performing current conduction and current blocking and provides functions of AC-DC conversion, frequency conversion, etc by controlling switching operations of the semiconductor devices. In the semiconductor devices in the power converter, losses are generated upon current conduction and switching during turning on and off. When a temperature of the semiconductor devices exceeds an operating limit point due to heat caused by the loss, current interruption cannot be done, so that the power converter cannot provide a desired operation. Accordingly, a cooling device for cooling the semiconductor devices is required in the power converter.

There are various types of semiconductor devices depending on an exterior, an electric characteristic, etc. Accordingly the cooling device is designed in accordance with respective characteristics. For example, JP 2013-73964 A discloses a semiconductor unit including a cooling device having two cooling surfaces, an electric terminal part, and a cooling unit with protrusions has a pin-shape.

JP 2000-060106 A discloses, similarly to JP 2013-73964 A, a cooling device including a high heat conductor, and an air-cooling fins on two cooling surfaces.

In addition, JP 2013-73964 A discloses, at a paragraph 0001, "the document relates to a power module having a high heat radiation characteristic and a high reliability and, at a paragraph 0011, "On one of the two confronting surfaces with larger area, is provided with a heat radiation part, and another surface has a heat radiation part". The heat radiation parts function as heat radiation walls for a module case 304. On an outer circumferential surface, a plurality of fins are uniformly formed.

In JP 2013-73964 A, a cooling water is used for cooling the semiconductor devices. However, it is necessary to additionally provide a water channel, a pump, and a heat radiator separately. In addition, the power module housing the semiconductors therein has two surfaces for cooling the heat from their inside, each having a heat radiation part having a lot of fins on each of the surfaces, which may cause the structure to be complicated.

In JP 2000-060106 A, an increase in the cooling characteristic has been tried by arranging a heat radiator near the semiconductor devices, etc. However, the structure becomes complicated. Accordingly, when this structure is applied to a power converter requiring a lot of power modules, a size of the power converter becomes large.

On the other hand, there is a need to use as an air-cooling type one the heating element such as the semiconductor module having originally designed as a water-cooling type. This is because the use of the air-cooling type one eliminates necessity of piping for the coolant, which is advantageous to maintenance. When the air-cooling type is adopted, it becomes necessary to provide cooling fins, etc. having a certain size on the heating element. However, the heating element, originally having designed as a water-cooling type one, has small pin fines (fins protruding in a pin shape), etc. However, such a heating element is designed without assumption that a large pressurizing force is applicable, so that there is no assumption that a strong pressure force is applied. Accordingly, when an external cooling fin is simply mounted by fastening bolts, the heating element may be damaged.

An aspect of the present invention is to provide a cooling structure for a heating element or a plurality of power modules with extensibility in arranging the heating elements such as a power module and with down-sizing a device for power converters, etc., using the heating elements such as a plurality of power modules.

An aspect of the present invention is to provide a cooling structure for a heating element, having pin fins and being capable of cooling the heating element for a semiconductor module, etc with avoidance of damage and a power converter.

SUMMARY OF THE INVENTION

A first aspect of the present invention provides a cooling structure comprising;

a plurality of heating elements arranged in a vertical direction, each including cooling surfaces respectively disposed on two confronting side surfaces extending in the vertical direction, and an electric terminal on a side surface extending the vertical direction and adjoining the two confronting side surfaces;

a plurality of heat receiving blocks pinching the heating elements arranged in the vertical direction on the two confronting side surfaces.

first and second cooling devices, each including a heat pipe including a plurality of heat radiation fins;

a pressure contacting part configured to contact the heating elements and the receiving block with a pressure force; and a blower configured to apply a wind to the heat radiation fins.

A second aspect of the present invention provides a cooling structure comprising:

a heating element having at least a cooling surface including a plurality of protruded pin fins;

a heat receiving plate having loose holes into which the pin fins are inserted at positions corresponding to the pin fins;

a cooling device including pair of pinching members configured to pinch the heating element and the heat receiving plate with a pressure force and cool the heat receiving plate; and a space reserving part, disposed on the heat receiving plate, configured to control a gap (interval) in a pair of the pinching members so as not to apply a pressure force by the pinching members to the heating element.

In the first aspect, a cooling structure for a heating element has extensibility in arranging the heating element such as a power module and capability of down-sizing a device such as a power converters, etc., using the heating elements such as a plurality of power modules.

In the second aspect, the heating element can be cooled with avoidance of damage.

BRIEF DESCRIPTION OF THE DRAWINGS

The object and features of the present invention will become more readily apparent from the following detailed description taken in conjunction with the accompanying drawings in which:

FIGS. 14A and 14B are perspective views in which the heat radiation fins of the first and second cooling devices are interlockingly arranged, in which FIG. 14A shows the whole view and FIG. 14B is an enlarged view.

FIG. 15A is a perspective view of the radiation fins in the case where the same radiation fins are installed at the heat pipes of the first and second cooling devices in which FIG. 15A shows the whole view and FIG. 15B is an enlarged view.

FIGS. 16A and 16B are perspective views in a case where the radiation fins of the first and second cooling devices are connected with waved rigid buffering parts in which FIG. 16A shows the whole view and FIG. 16B is an enlarged view.

The same or corresponding elements or parts are designated with like references throughout the drawings.

DETAILED DESCRIPTION OF THE INVENTION

First Embodiment

A first embodiment of the present invention is described blow with reference to the drawings.

Figure 9:
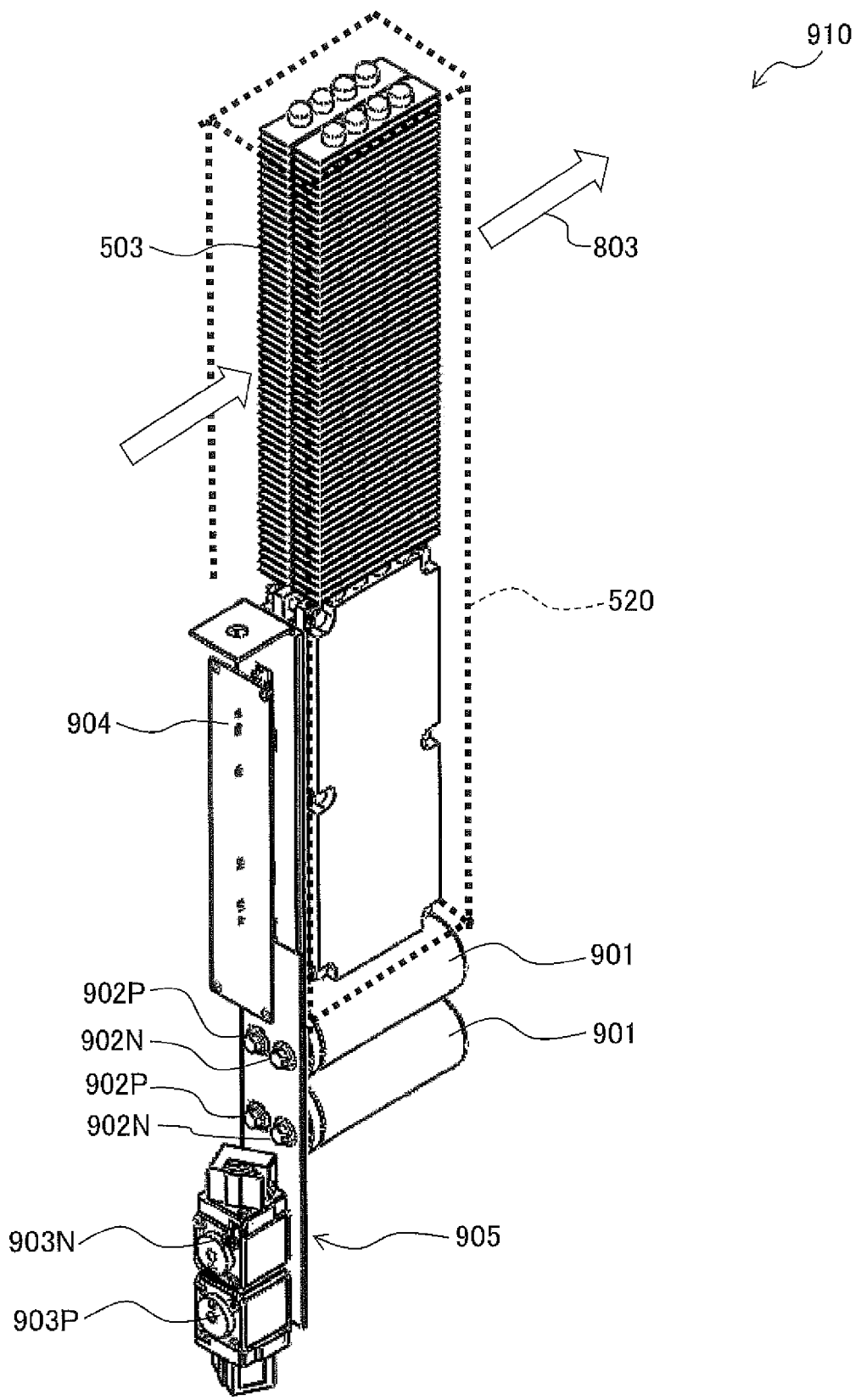
FIG. 9 is a perspective view of the single converter unit.
Figure 12:
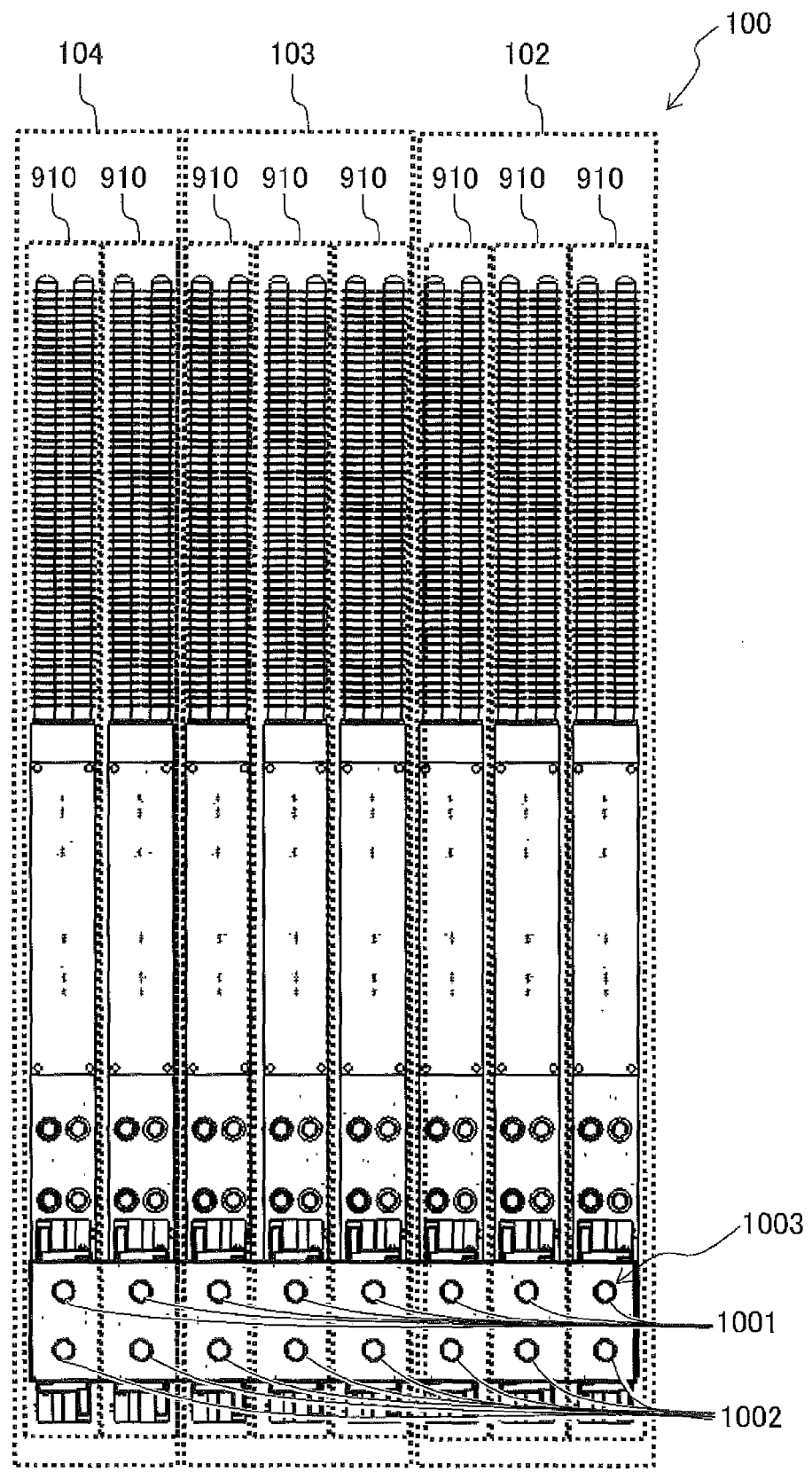
FIG. 12 is an illustration showing the power converter in which a plurality of the single converter units are arranged.

A power converter 100 (see FIGS. 1, 12, 13) includes a plurality of single converter units 910 (see FIGS. 9 and 12). The single converter unit 910 includes a double-sided-cooling power unit 520 (see FIG. 5, semiconductor unit for the power converter) including a plurality of double-sided-cooling power modules 500 (semiconductor module, see FIG. 7). Respective components in the power converter 100 are described below.

Figure 1:
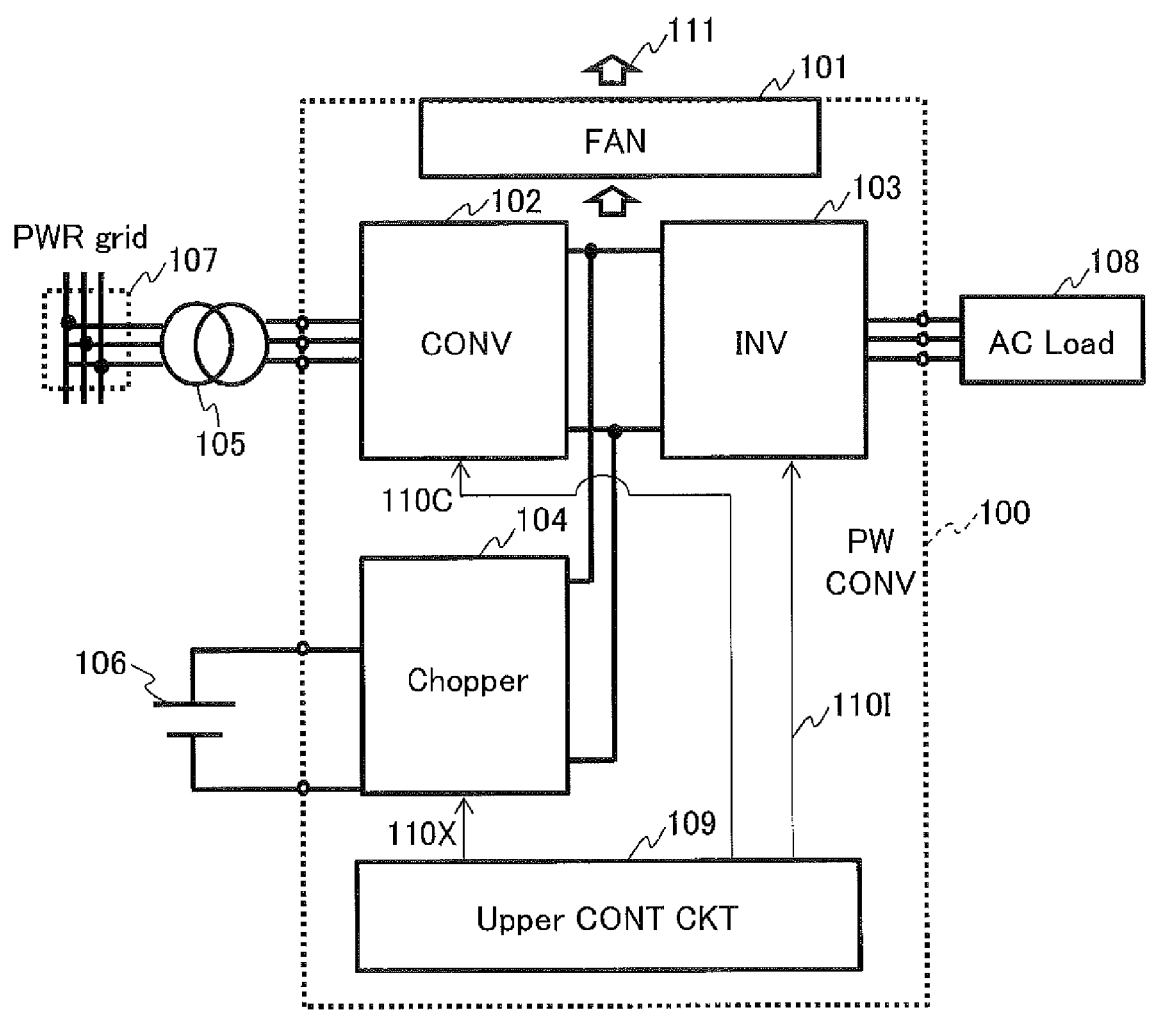
FIG. 1 is a circuit diagram of a power converter according to a first embodiment of the present invention.

FIG. 1 is a schematic circuit showing the power converter according to the first embodiment. As shown in FIG. 1, the power converter 100 is supplied with an AC power having a voltage which is appropriately adjusted through a transformer 105 from a power receiving point 107 of a power grid. The supplied AC power is inputted into a converter 102 which converts the supplied AC power into a DC power. The DC power is inputted into the inverter 103 to convert the DC power into an AC power. The AC power is consumed by a three-phase AC load 108.

On the other hand, when the power is not supplied to the converter 102 due to a trouble, etc. in the power grid, an upper control circuit 109 detects this and controls a chopper 104 to operate. A DC power supplied from a battery 106 to the chopper 104 is adjusted to an appropriate power and inputted into an inverter 103. The DC power inputted into the inverter 103 is converted into an AC power which is consumed by the three-phase AC load 108.

The operation described above is judged by the upper control circuit 109 as to whether the operation is a desired operation or not. The converter 102, the inverter 103, and the chopper 104 generate heat during their operations, so that temperatures increase. To suppress the temperature increase, a cooling wind 111 is supplied to the converter 102, the inverter 103, and the chopper 104 by a cooling fan (blower) 101. Out of the electric systems as described above, the cooling fan 101, the converter 102, the inverter 103, the chopper 104, the upper control circuit 109, etc. are housed in the power converter 100 according to the embodiments.

Figure 2:
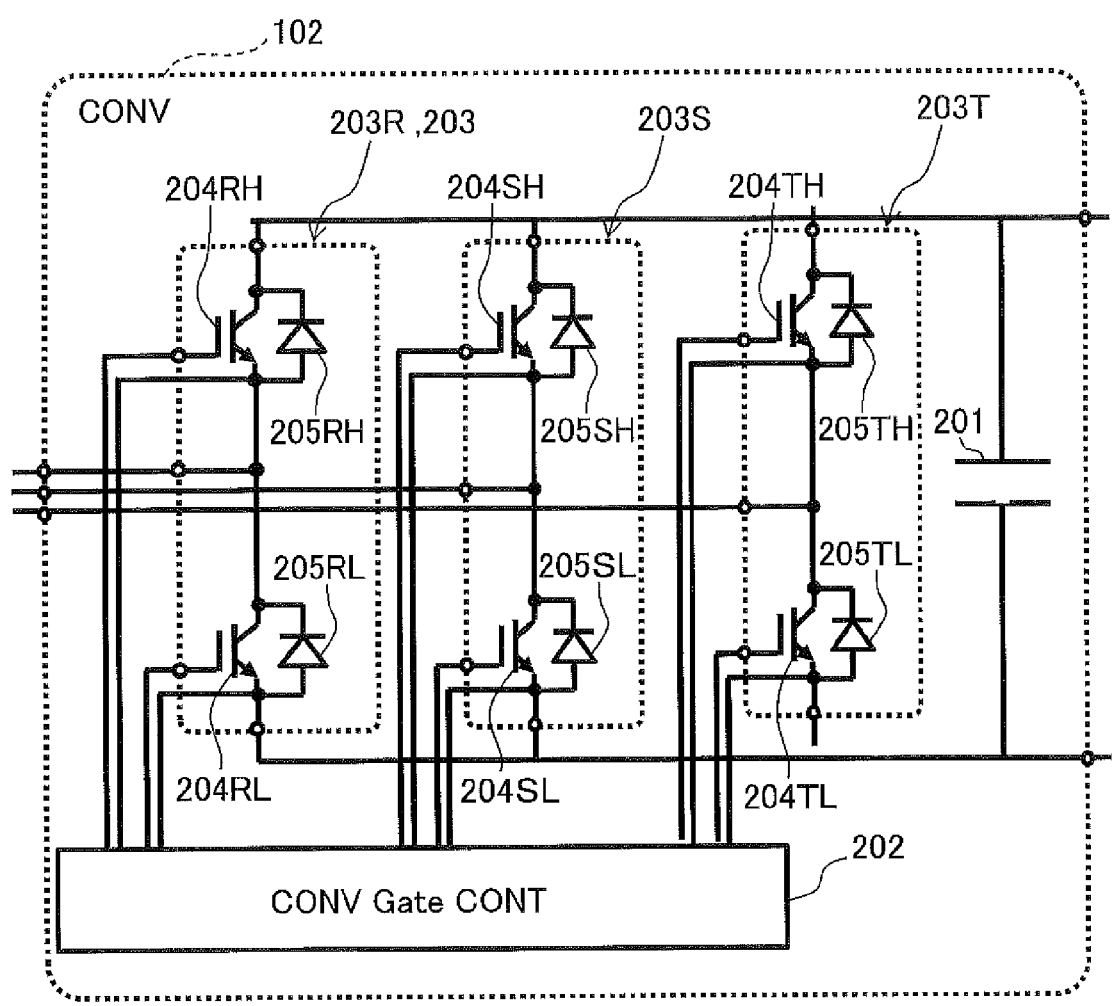
FIG. 2 is a circuit diagram of a converter of the power converter.
Figure 3:
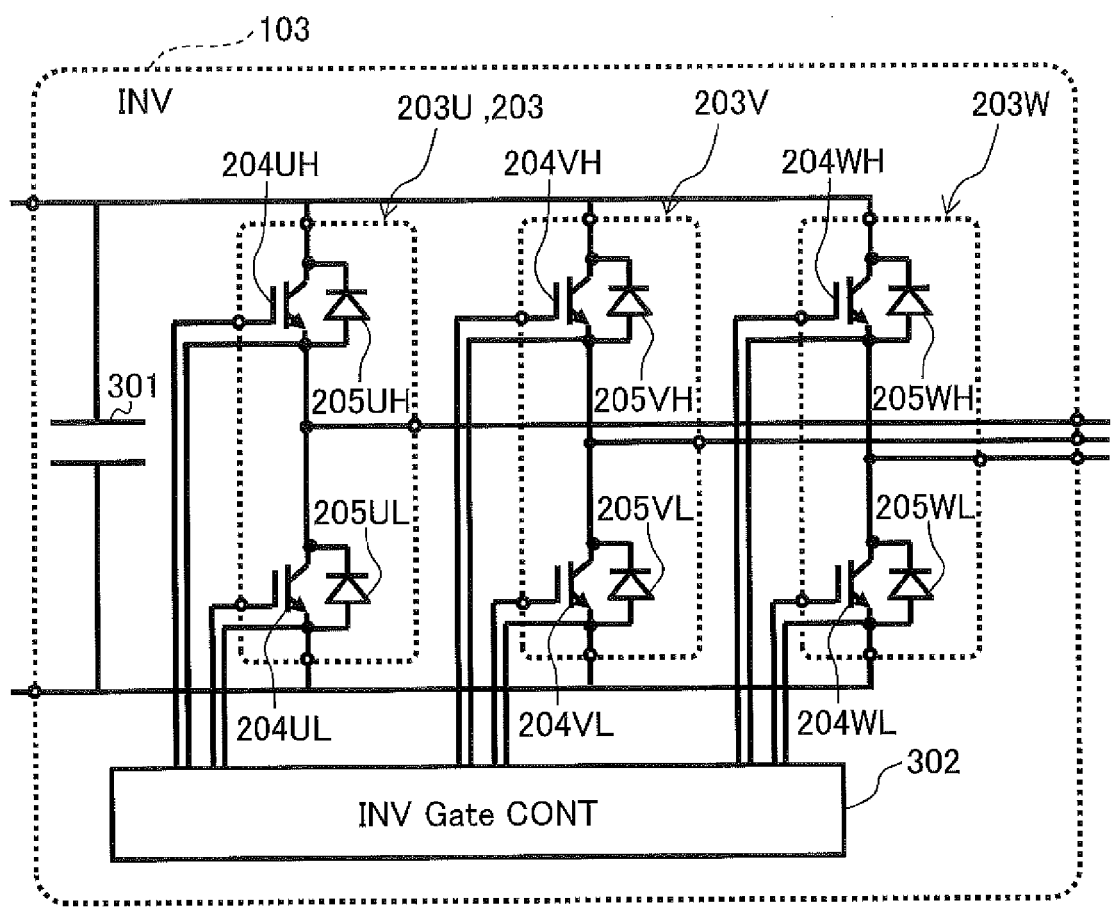
FIG. 3 is a circuit diagram of an inverter for the power converter.
Figure 4:
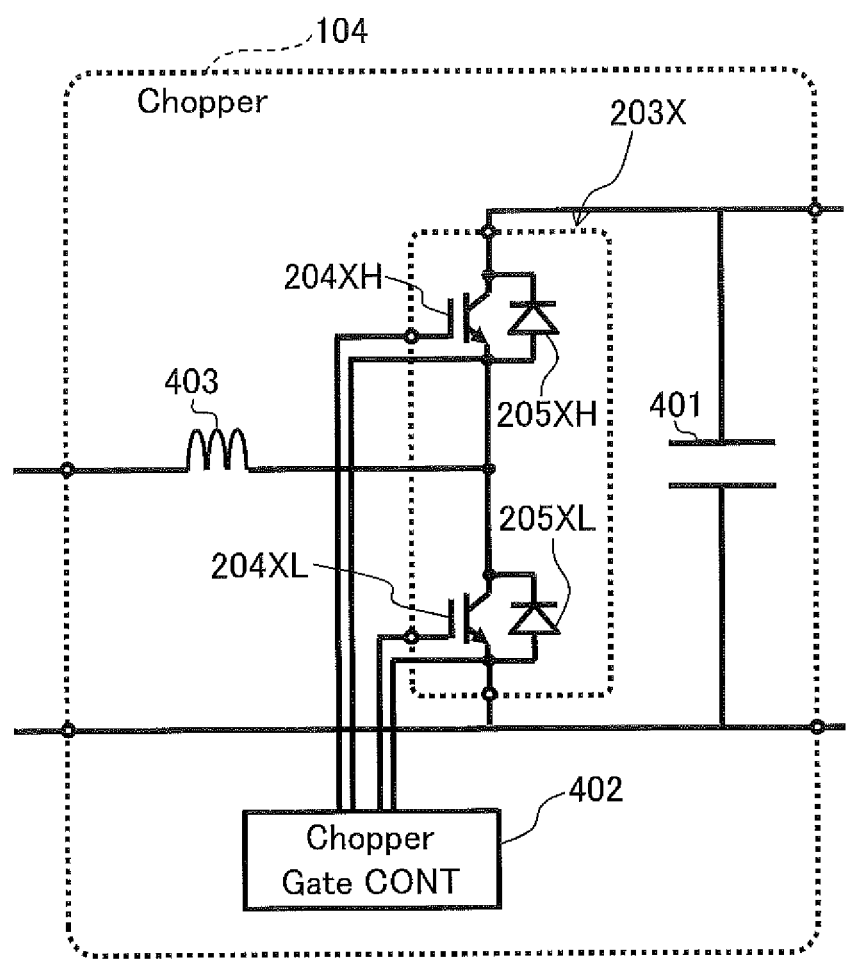
FIG. 4 is a circuit diagram of a chopper for the power converter.

FIG. 2 is a circuit diagram of the converter in the power converter. FIG. 3 is a circuit diagram of the inverter in the power converter. FIG. 4 is a circuit diagram showing the chopper in the power converter. With reference to FIG. 2 to FIG. 4, circuits of the converter 102, the inverter 103, and the chopper 104 are described.

The converter 102 shown in FIG. 2 includes leg 203s (203R, 203S, 203T) each configured with a plurality of semiconductor devices. The leg 203 includes a plurality of switching devices 204 (for example, 204RH, 204RL) and a plurality of diode devices 205 (for example, 205RH, 205RL). Hereinafter, in the case where a whole of components are generally referred, the leg 203, the switching device 204, and the diode device 205 are used.

Both ends of the leg 203 are connected to a capacitor 201. An upper arm of the leg 203R includes a switching device 204RH and a refluxing diode device 205RH. A lower arm of a leg 203R includes a switching device 204RL and a refluxing diode device 205RL. Similarly, an upper arm of the leg 203S includes a switching device 204SH and a refluxing diode device 205RH. Further, a lower arm of the leg 203S includes a switching device 204SL and a refluxing diode device 205SL. An upper arm of a leg 203T includes a switching device 204TH and a refluxing diode device 205TH. A lower arm of the leg 203T includes a switching device 204TL and a refluxing diode device 205TL.

Switching signals to the switching devices 204RH, 204RL, 204SH, 204SL, 204TH, 204TL are controlled by a converter gate controller 202, which is a lower control unit.

Further, in the switching device according to the present invention, any devices capable of turning on and off can be used. For example, there are an IGBT (Insulated Gate Bipolar Transistor), and a power MOSFET (Metal Oxide Semiconductor Field Effect Transistor).

The inverter 103 shown in FIG. 3 includes a plurality of the legs 203 (203U, 203V, 203W) configured with a plurality of semiconductor devices and both ends of the leg 203 are connected to a capacitor 301. The upper arm of the leg 203U includes a switching device 204UH and a refluxing diode 205UH. A lower arm of the leg 203U includes a switching device 204UL and a refluxing diode 205UL. Similarly, an upper arm of a leg 203V includes a switching device 204VH and a refluxing diode 205VH. A lower arm of the leg 203V includes a switching device 204VL and a refluxing diode 205VL. An upper arm of a leg 203W includes a switching device 204WH and a refluxing diode 205WH. A lower arm of the leg 203W includes a switching device 204WL and a refluxing diode 205WL. Switching signal applied to the switching devices 204UH, 204UL, 204VH, 204VL, 204WH, 204WL are controlled by an inverter gate control unit 302 as a lower control part.

The chopper 104 includes the leg 203 configured with semiconductor devices (203X). The both ends of the leg 203 are connected to a capacitor 401. An upper arm of a leg 203X includes a switching device 204XH and a refluxing diode 205XH. A lower arm of the leg 203 includes a switching device 204XL and a refluxing diode 205XL. A junction point between the switching devices 204XH and 204XL is connected to the battery 106 through a reactor 403 (see FIG. 1). The switching signals to the switching devices 204XH, 204XL are controlled by a chopper gate control unit 402.

As an example of the control operation, the chopper gate control unit 402 is amplified.

The switching signals are applied to the chopper 104 through a boosting and stepping-down switching circuit (not shown). These selections depend on a larger-smaller relation in the output voltage of the converter 102 (commutation function). When an output of the chopper 104 is greater than an output voltage of the converter 102, a PWM (Pulse Width Modulation) signal is transmitted to the switching device 204XL. In a reverse case, the PWM signal is transmitted to the switching device 204XH. When an electric power of the battery 106 is discharged, the switching device 204XL is switched in accordance with the PWM signal. When the switching device turns on, an energy is stored in the reactor 403. On the other hand, the switching device turns off, due to the energy from the voltage of the battery 106 and the reactor 403, a voltage higher than the voltage of the battery 106 is charged in the capacitor 401 through the refluxing diode 205XH connected to the switching device 204XH.

When the battery 106 is charged with an electric power, the switching device 204XH is switched in accordance with the PWM signal, so that an electric power in the capacitor 401 is charged in the battery 106 through the reactor 403 when the switching device 204XH is turned on. When the switching device 204XH is turned off, the energy stored in the reactor 403 is circulated through the diode 205XL connected to the switching device 204XL. The electric power in the battery 106 is charged and discharged by these operations.

In addition, there may be a case where the capacitors may be arranged integrally. However, in this embodiment, the capacitors 201, 301, 401 are divided from a point of view of standardizing the configuration of the single converter unit 910 (see FIG. 9) described later. More specifically, the capacitors 201, 301 are further divided for each of the legs 203.

In the converter 102, AC to DC conversion is performed and in the inverter 103, DC to AC conversion is performed by conducting and blocking of current by the switching device 204 and a diode 205 in the leg 203 shown in FIGS. 2 to 4. During conduction, a loss is generated by the resistor in the switching device 204 and the diode device 205. Further, when switching is made from the conduction state to the blocking state, a loss is generated. Accordingly, heat generation is caused by the operation of the power converter 100.

(Air-Cooling Type of Double-Sided-Cooling Power Unit)

Next, a cooling structure in the air-cooling type of double-sided (two confronting side surfaces)-cooling power unit 520 is described with reference to FIG. 8.

Figure 5:
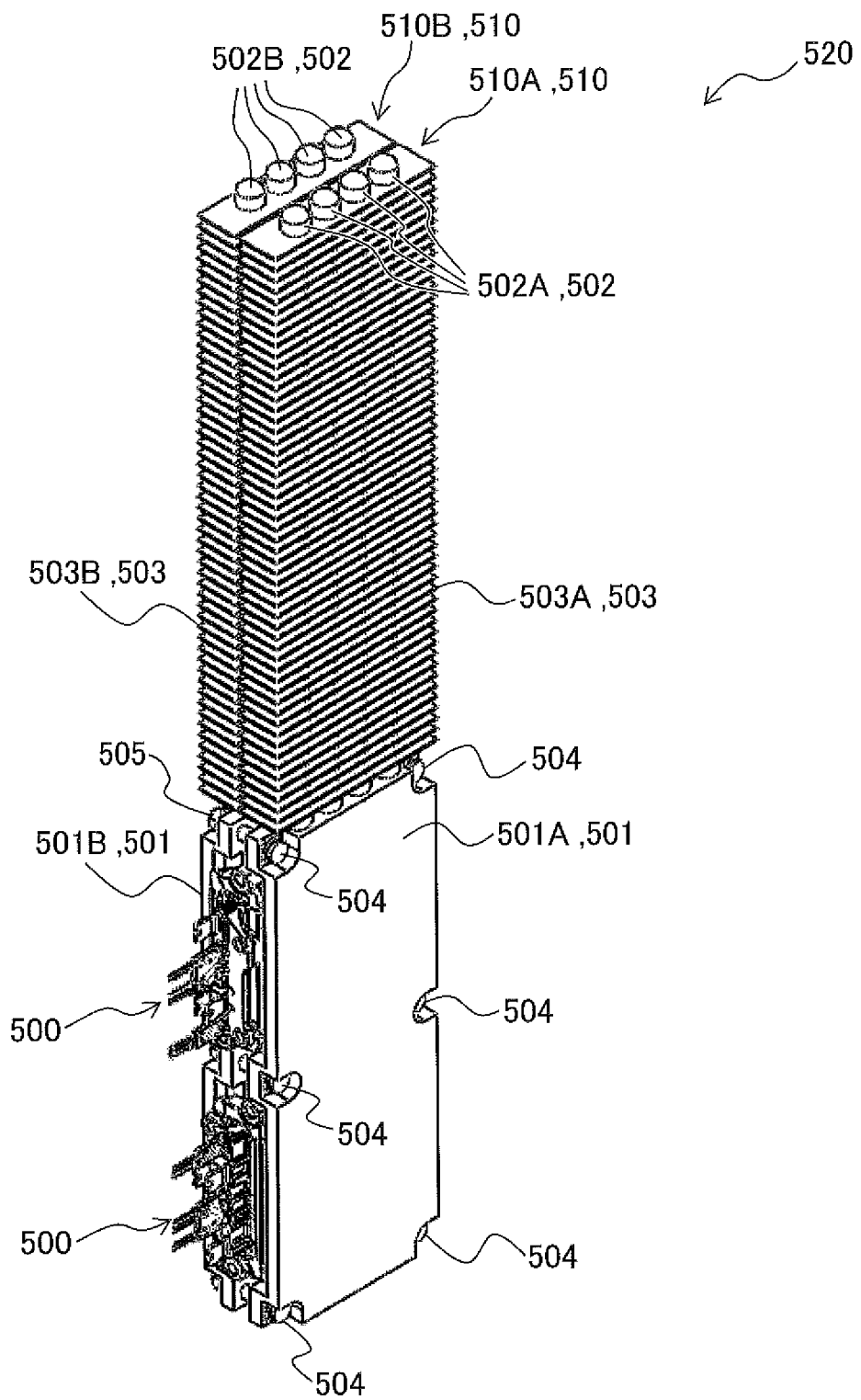
FIG. 5 is a perspective view of an air-cooling type of power unit.

FIG. 5 is a perspective view of the air-cooling type of double-sided-cooling power module in which a plurality of the double-sided-cooling power modules are disposed.

Figure 6:
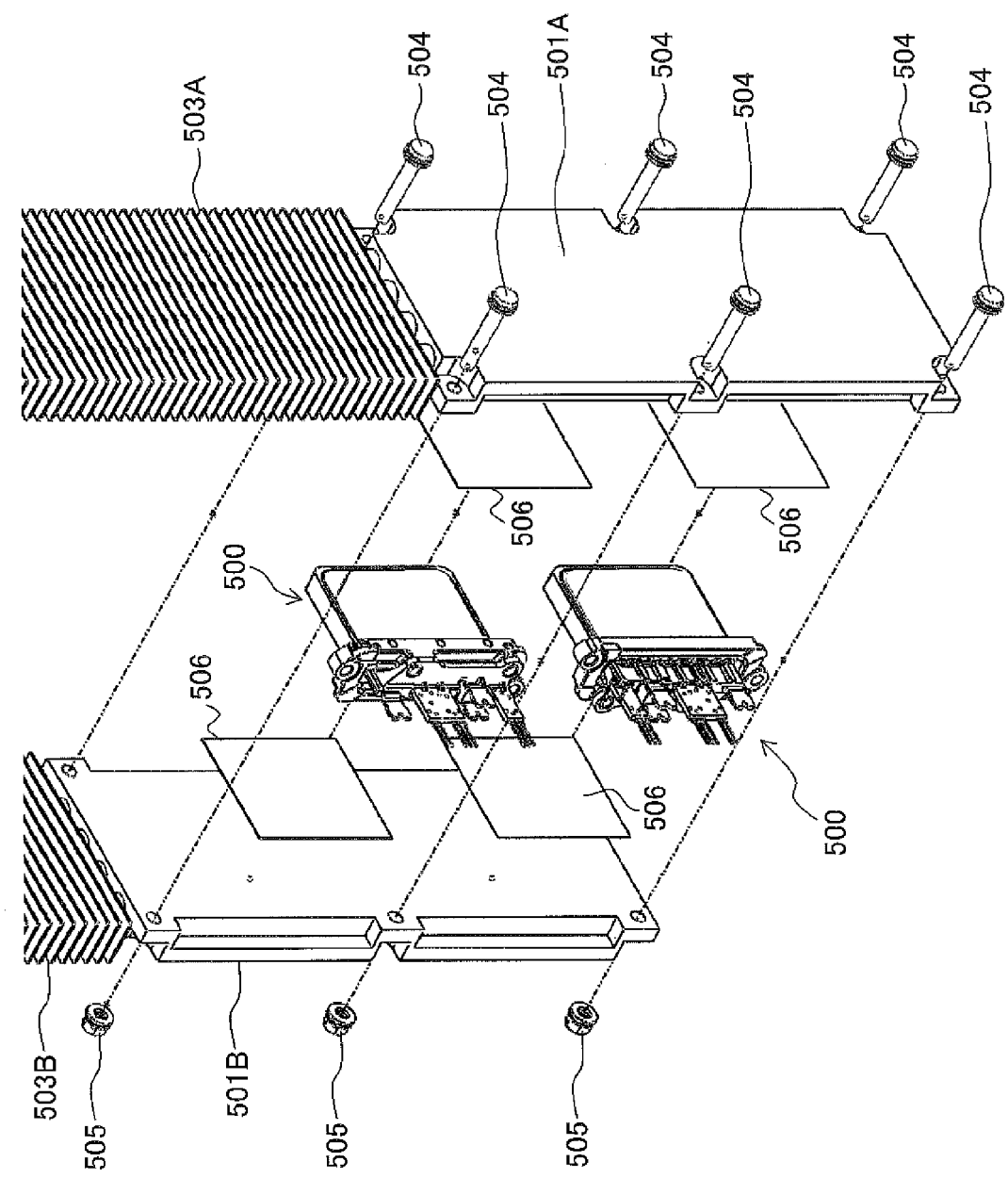
FIG. 6 is an exploded drawing showing arrangement of power module having two face cooling in the air-cooling type of double-sided-cooling power unit.

FIG. 6 is an exploded view showing arrangement of the double-sided-cooling power modules in the air-cooling type of double-sided-cooling power unit.

The air-cooling type of double-sided-cooling power unit 520 is configured to basically include a cooling device 510 (a first cooling device 510A, a second cooling device 510B) and a plurality of the double-sided-cooling power modules 500. The cooling device 510 includes a heat receiving block 501, a heat pipe 502, and a heat radiating fin 503. The first cooling device 510A includes a heat receiving block 501A, a heat pipe 502A, and a heat radiation fin 503A. The second cooling device 510B includes a heat receiving block 501B, a heat pipe 502B, and a heat radiation fin 503B. The air-cooling type of double-sided-cooling power unit 520 has a slim and simple structure with such expandability that a plurality of power modules can be arranged in the actual structure of the double-sided-cooling power module 500.

When the air-cooling type of double-sided-cooling power unit 520 is assembled, more than one double-sided-cooling power modules 500 including semiconductor devices therein as a heat source, are sandwiched between the heat receiving blocks 501. After sandwiching, the double-sided-cooling power module 500 and the heat receiving block 501 are fixed with bolts 504 and nuts 505 as a pressure-contacting means for providing pressure-contact therebetween. Inside of the heat receiving block 501, one end of more than one heat pipe 502 are connected. The other ends of the heat pipe 502 extend upwardly and are connected to a plurality of the heat radiating fins 503 at parts protruding from the heat receiving blocks 501.

Between the double-sided-cooling power module 500 and the heat receiving blocks 501A, 510B, a soft thermally conductive grease 506 (thermal conductive agent) having a high thermal conductivity is coated to reduce a poor heat contact caused by a roughness of respective surfaces and tolerance.

Figure 7B:
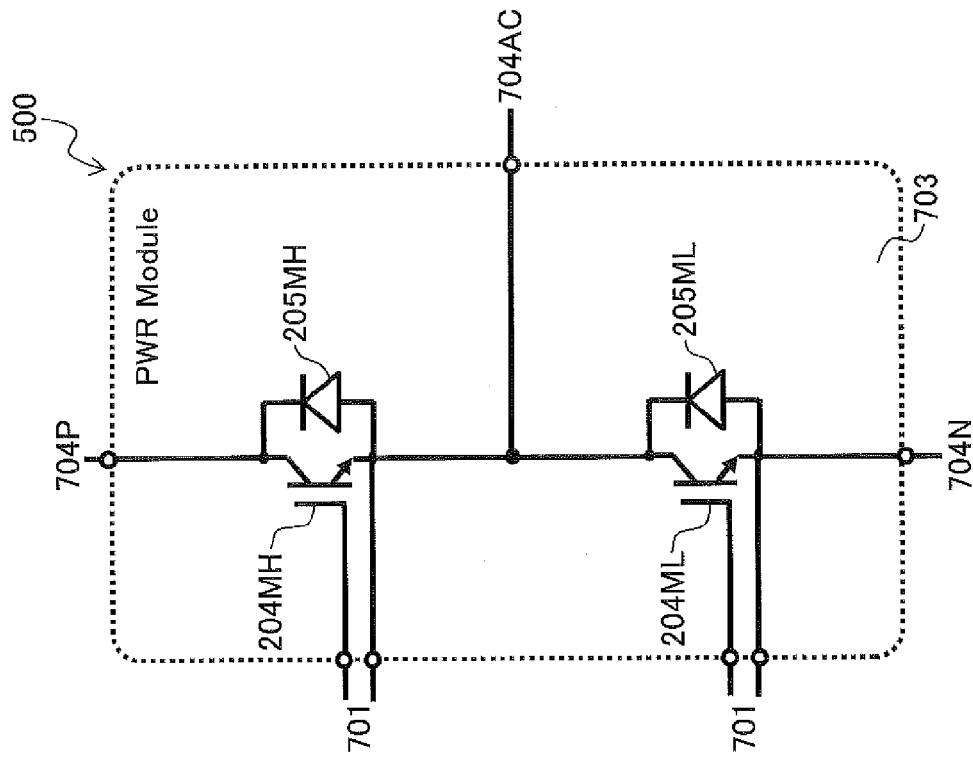
FIG. 7B is a schematic circuit diagram.
Figure 7A:
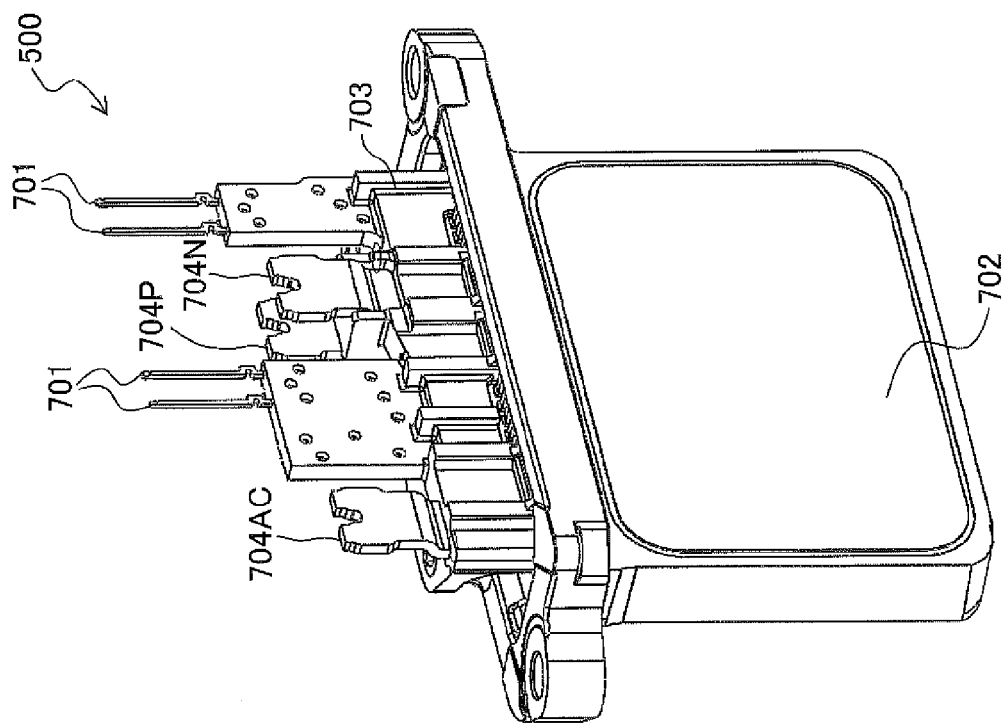
FIG. 7A is a perspective view of the double-sided-cooling power module.

FIG. 7A is a perspective view of the double-sided-cooling power module, and FIG. 7B is a schematic circuit diagram. As shown in FIG. 7B, the double-sided-cooling power module 500 includes a switching devices 204MH, 204ML, and diodes 205MH, 205ML. Respective semiconductors are connected to each other to form the leg 203 (for example, see FIG. 2).

As shown in FIG. 7A, a P terminal 704P (DC positive terminal), an N-terminal 704N (DC negative terminal), an AC terminal 704AC, and a gate terminal 701 are exposed at a top surface thereof to be connectable with an External with electrical insulation. When the semiconductor device described above is operating, electrical conduction to the external via these electric terminals. On the other hand, heat simultaneously generated is exhausted vie a cooling surface 702 being connected to an insulator 703. More specifically, the gate terminal 701 is electrically insulated from the cooling surface 702, and the heat transferring paths are independent from the electric path.

The double-sided-cooling power module 500 according to the embodiment includes: the cooling surfaces 702 on two confronting side surfaces and the P terminal 704P, a N terminal 704N, the AC terminal 704AC, and the gate terminal 701, which are electric terminals on one of the vertically extending side surfaces adjoining the cooling surface 702.

Figure 8:
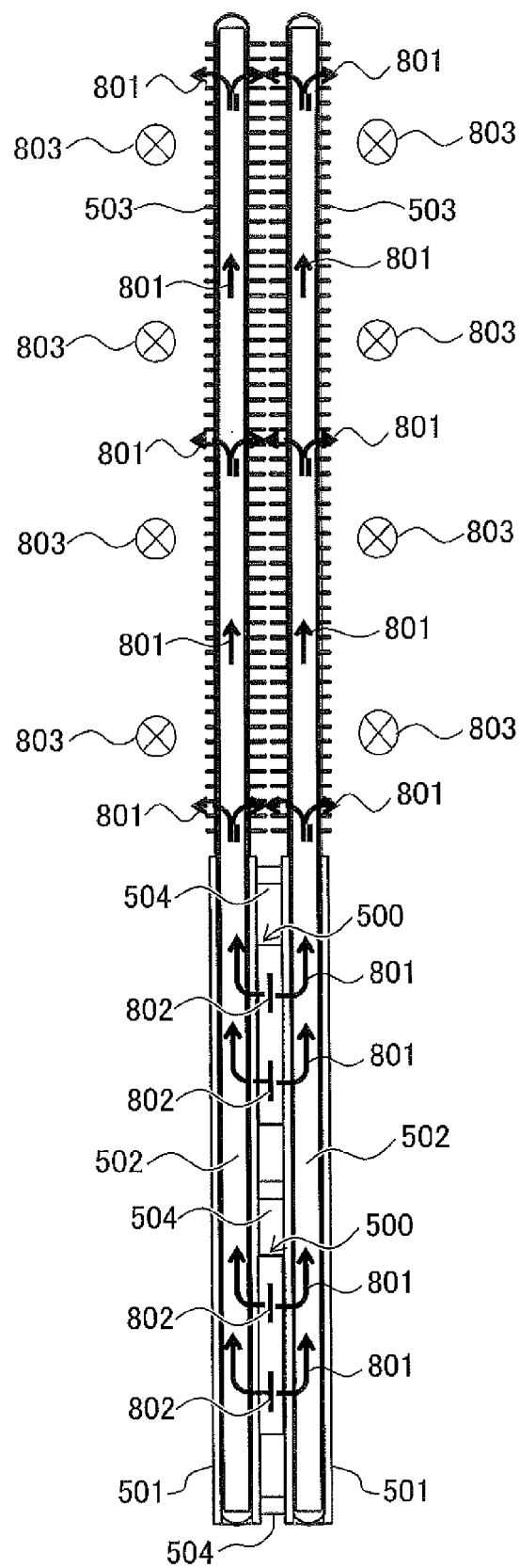
FIG. 8 is an illustration showing heat transferring path of an air-cooling type of double-sided-cooling power unit.

FIG. 8 is an illustration showing a heat transferring path of the air-cooling type of double-sided-cooling power unit. FIG. 8 shows a cross section of a part in FIG. 5. In a plurality of the double-sided-cooling power modules 500 arranged in vertical direction, heat generated by semiconductor devices 802 included therein transfers to the heat pipe 502 through the heat receiving block 501, which rapidly transfers a heat 801 in the vertical direction. The heat 801 is transferred to the heat radiating fins 503 and exhausted by a cooling wind 803 flowing between the heat radiating fins 503.

(Single Converter Unit)

Figure 10:
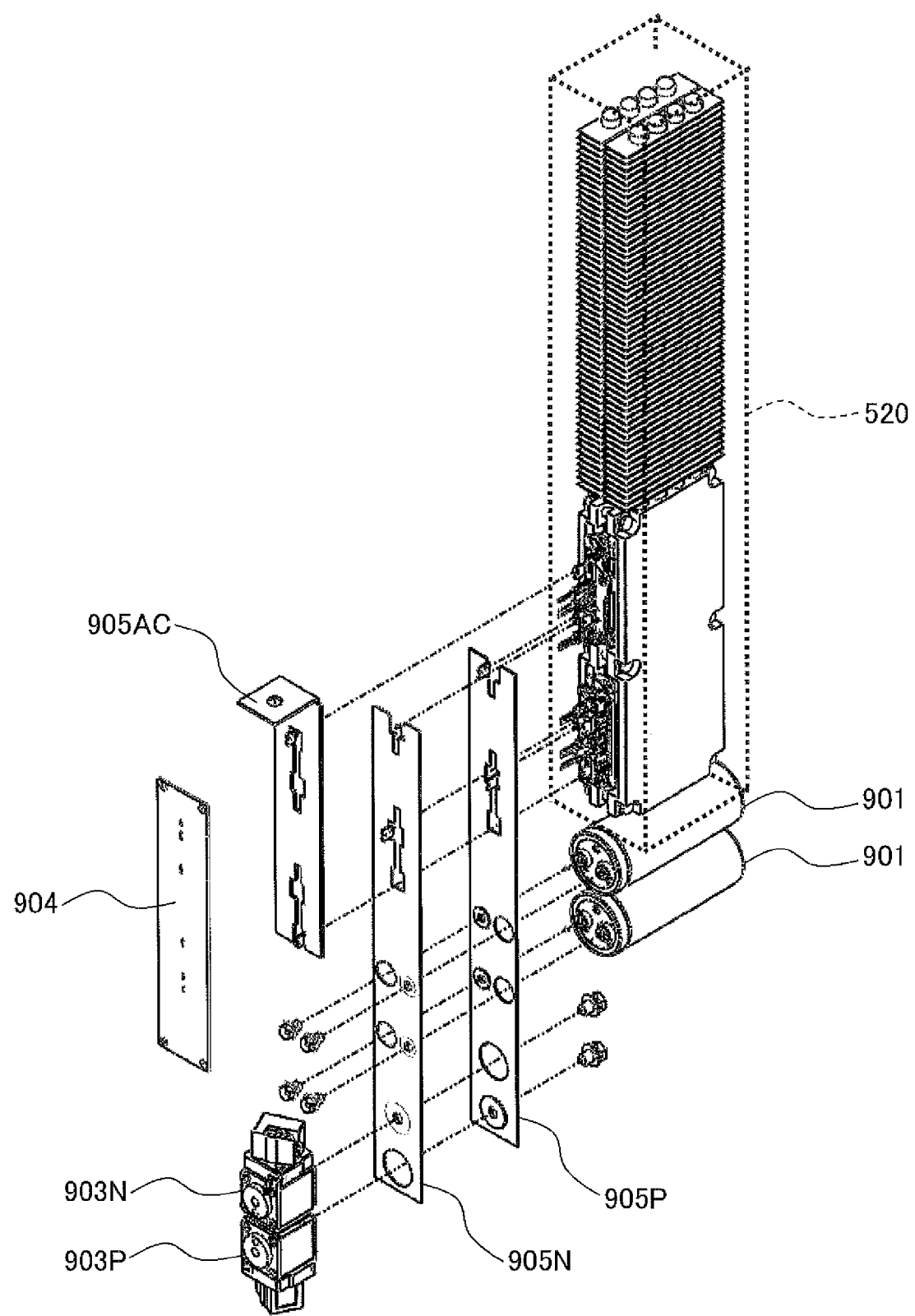
FIG. 10 is an exploded view showing an arrangement of the single converter unit.
Figure 11:
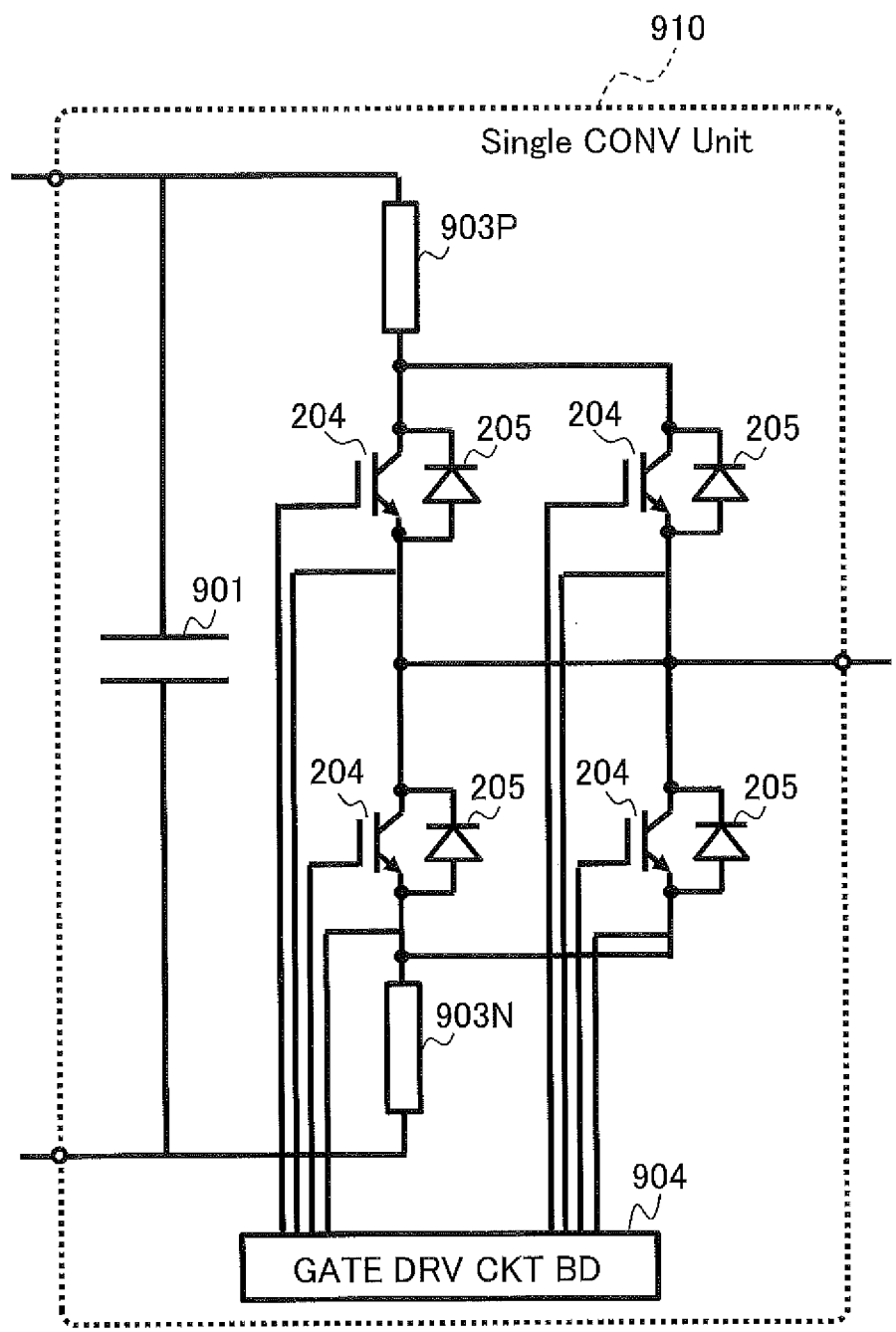
FIG. 11 is a schematic circuit diagram of the single converter unit.

A single converter unit 910 in the power converter 100 according to the embodiment of the present invention is described with reference to FIGS. 9 to 11. FIG. 9 is a perspective view of the single converter unit. FIG. 10 is an exploded view showing an arrangement of the single converter unit. FIG. 11 is a schematic circuit diagram of the single converter unit.

In the single converter unit 910 shown in FIG. 9, the P terminal 704P, the N terminal 704N, the AC terminal 704AC, which are electric terminals of the air-cooling type of double-sided-cooling power unit 520 (see FIG. 7), are connected to a P layer, an N layer, and an AC layer of a P·N·AC laminated bus bar 905, respectively. Further, the gate terminal 701, which is an electric terminal, is connected to a gate driver circuit board 904. Positive terminals 902P and negative terminals 902N of a plurality of a capacitors 901 are connected to the P layer and the N layer of the P·N·AC laminated bus bar 905, respectively. Further, a positive phase 903P and a negative phase 903N are connected to the P layer and the N layer of the P·N·AC laminated bus bar 905, respectively.

FIG. 10 is an exploded view of the single converter unit 910 FIG. 9. The P·N·AC laminated bus bar 905 includes a P bus bar 905P, an N bus bar 905N, and an AC bus bar 905AC which are electrically insulated each other with insulation layers (not shown). In the single converter unit 910, the P terminal 704P, the N terminal 704N, and the AC terminal 704AC of the double-sided-cooling power module are connected to the P bus bar 905P, the N bus bar 905N, and the AC bus bar 905AC, respectively. The gate terminal 701 of the double-sided-cooling power module 500 is connected to the gate driver circuit board 904. Further, the P terminal and the N terminal of the capacitor 901 are connected to the P bus bar 905P and the N bus bar 905N, respectively. The structure described above is shown in an electric circuit diagram as shown FIG. 11.

In the first embodiment, as shown in FIG. 9, the cooling wind 803 is caused to flow to the heat radiating fin 503 from the side at which the electric terminals are installed. This structure provides such an advantageous effect that a cooling effect does not decrease among the single converter units 910 though the single converter units 910 are laterally arranged in the power converter 100 at a high density. In the present embodiment, the cooling wind comes from the side at which the terminals are installed. However, the present invention is not limited to this. For example, the cooling wind may be caused to flow from a side opposite to the electric terminals to the heat radiating fins 503.

(Power Converter)

Figure 13:
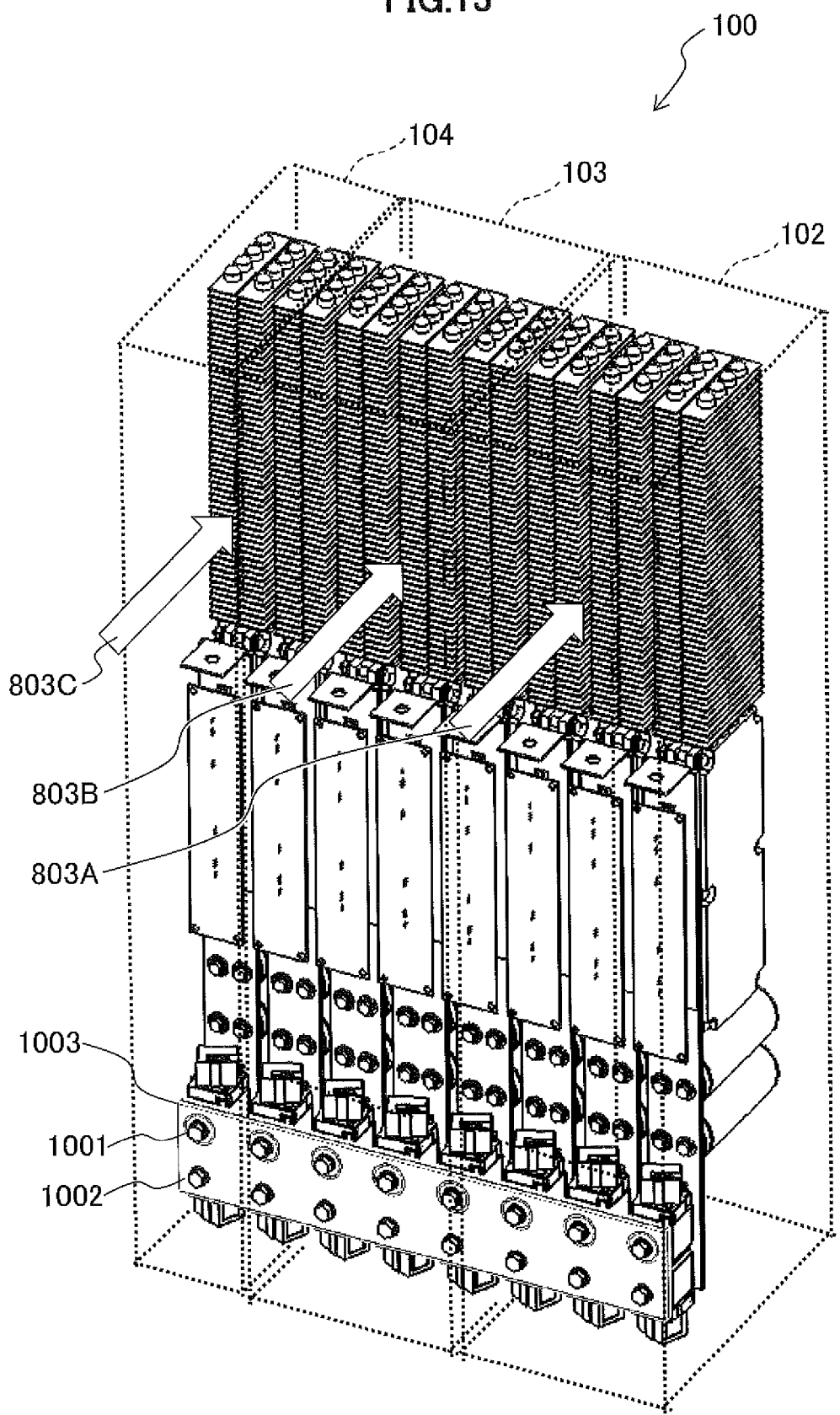
FIG. 13 is an illustration for illustrating a method of cooling the single converter unit in the power converter.

FIG. 12 is an illustration showing the power converter in which a plurality of the single converter units are arranged. FIG. 13 is an illustration for illustrating a method of cooling the single converter units in the power converter.

The converter 102, the inverter 103, and the chopper 104 are laterally arranged in the power converter 100. The converter 102 includes the single converter units 910 corresponding to the three legs 203R, 203S, 203T shown in FIG. 2. The inverter 103 includes the single converter units 910 corresponding to three the legs 203U, 203V, 203V shown in FIG. 3. Though the chopper 104 is shown in FIG. 4 with one of the legs 203X. However, actually, the single converter unit 910 includes a circuit corresponding to the two legs 203X shown in FIG. 4.

The converter 102 is configured by connecting the three single converter units 910 by connecting a P·N interphase lamination bus bar 1003 to positive terminals 1001 and negative terminal 1002. The inverter 103 is configured similarly to the converter 102. The chopper 104 is configured by connecting the two single converter units 910 in parallel.

In the converter 102, the inverter 103, and the chopper 104 having the configurations described above, a plurality of single converter units 907 may be connected in parallel for one leg. This can increase a rated output capacity of the power converter.

In the method of cooling the single converter units 910 in the power converter shown in FIG. 13, similar to FIG. 9, the cooling wind 803 is caused to flow from the side of the electric terminals to the heat radiating fin 503. This provides such an advantageous effect that the cooling effect among the single converter units 910 is not decreased through the single converter units 910 are laterally arranged in the power converter 100 at a high density. Further, in the case where calorific values of the converter 102, the inverter 103, and the chopper 104 are different from each other, velocities of cooling winds 803A, 803B, and 803C may be changed.

(Structure of the Heat Radiation Fin)

Next, a structure of the heat radiation fin is described with reference to FIGS. 14 to 16.

FIGS. 14A and 14B are perspective views in which the heat radiation fins of the first and second cooling devices are interlockingly arranged, in which FIG. 14A shows the whole view and FIG. 14B is an enlarged view. In the heat radiating fin 503 shown in FIG. 14, a heat radiating fin 1401A and a heat radiating fin 1401B are different in height from the heat receiving blocks 501A, 501B and arranged interlockingly in which one fin of one of the first and second cooling device 510A and 510B is inserted into a space between the adjoining radiation fins of another of the first and second cooling device 510A and 510B. This is a difference of the heat radiating fin 503 shown in FIG. 14 from the heat radiating fin 503 shown in FIG. 5. This structure has an advantageous effect in that heat radiation areas of the heat radiating fin 1401A and the heat radiating fin 1401B are increased.

FIG. 15A is a perspective view of the radiation fins in the case where the same radiation fins are installed at the heat pipes of the first and second cooling devices in which FIG. 15A shows the whole view and FIG. 15B is an enlarged view. A radiation fin 1501 in FIG. 15 is different from the heat radiating fin 503 shown in FIG. 5 in that the same heat radiation fins are used for both of the first cooling device 510A and the second cooling device 510B. Even in a case where calorific values are different from each other between a side of the first and second cooling devices 510A, 510B. This provides an advantageous effect in that the calorific values can be equalized with the same radiation fins.

FIG. 16A is a perspective view in a case where the radiation fins of the first and second cooling devices are connected with a waved rigid buffering part in which FIG. 16A shows the whole view and FIG. 16B is an enlarged view. In heat radiating fins 1601 shown in FIG. 16 are connected between the first cooling device 510A and the second cooling device 510B with waved stiffness buffering parts 1602. This is a difference from the heat radiating fin 503 shown in FIG. 5. This provides an advantageous effect in that the air-cooling type of double-sided-cooling power unit 520 configured to include the first cooling device 510A and the second cooling device 510B can increase a mechanical strength of the air-cooling type of double-sided-cooling power unit 520.

A semiconductor unit for a power converter according to the embodiment (for example, the air-cooling type of double-sided-cooling power unit 520) includes:

a double-sided cooling semiconductor module (for example, the double-sided-cooling power module 500) including a first cooling surface (for example, the cooling surface 702) electrically insulated from an electric terminal and a second cooling surface (for example the cooling surface 702) confronting the first cooling surface; a heat receiving block (for example, the heat receiving block 501A) being in contact with the first cooling surface of a plurality of the double-sided cooling semiconductor modules; a first heat pipe (for example, the heat pipe 502A) of which one end is thermally coupled to the first heat receiving block thereinside; more than one heat radiation fins (for example, the heat radiation fin 503A) thermally coupled to another end of the first heat pipe; a second heat receiving block (for example, the heat receiving block 501B) being in contact with the second cooling surface of a plurality of the double-sided cooling semiconductor modules; a second heat pipe (for example, the heat pipe 502B) of which one end is thermally coupled to the second heat receiving block thereinside; more than one heat radiation fins (for example, the heat radiation fin 503B) thermally coupled to another end of the second heat pipe; a fixing device configured to fix the first and second heat receiving blocks (for example, the bolt 504 and the nut 505).

This provides an advantageous effect in expandability of arrangement of the double-sided-cooling power module 500 and down-sizing the air-cooling type of double-sided-cooling power unit 520 using a plurality of the air-cooling type of double-sided-cooling power unit 520. The air-cooling type of double-sided-cooling power unit 520 shown in FIG. 5 has been described about assembling the two double-sided-cooling power modules 500. However, the present invention is not limited to this. For example, in FIG. 5, the double-sided-cooling power modules 500 are arranged in a vertical direction. However, more than two double-sided-cooling power modules 500 may be arranged.

In summary, the semiconductor unit for the power converter includes cooling surface confronting each other, more than one double-sided-cooling semiconductor modules having electric terminal part electrically insulated therein, and the cooling device 510 (heat radiator) sandwiching the double-sided-cooling semiconductor modules from both sides thereof. The cooling device 510 includes a member called the heat receiving block 501 having flat surfaces, the heat pipe 502, and the heat radiating fin 503.

Semiconductor unit for the power converter is characterized by having expandability of arrangement of the double-sided-cooling power module, and a slim and simple structure.

Contacting cooling surfaces of the double-sided-cooling power module to the flat surfaces of the heat receiving block 501 enable to transmit the heat generated by the semiconductor device 802 in the double-sided-cooling power module to the heat receiving block 501. Inside the heat receiving block 501, the heat pipe 502 straightly extends in a direction in parallel to the flat surface of the heat receiving block 501. One end of the heat pipe 502 is embedded in the heat receiving block 501 and the other end extends outwardly from the heat receiving block 501. The heat pipe 502 extending from the heat receiving block 501 is connected to the heat radiating fin 503. When the cooling wind 803 is brown between the heat radiating fins 503, heat exchange between the heat radiating fin 503 and the cooling wind 803 is provided. As the result, the semiconductor device 802 in the double-sided-cooling semiconductor module is cooled.

According to the cooling structure configured as described above, the heat generated by the semiconductor device 802 can be rapidly dispersed via the heat pipe 502 and transmitted to the heat radiating fin 503, so that an efficiency of the heat radiation fin can be increased. Further, connection between the cooling device 510 and the doublesided-cooling semiconductor module is made through the heat receiving block 501. Accordingly, for example, this allows a defected double-sided-cooling semiconductor module to be easily replaced.

Second Embodiment

<Electric Structure of the Power Converter>

Next, a power converter 150 according to a second embodiment of the present invention is explained.

Figure 17:
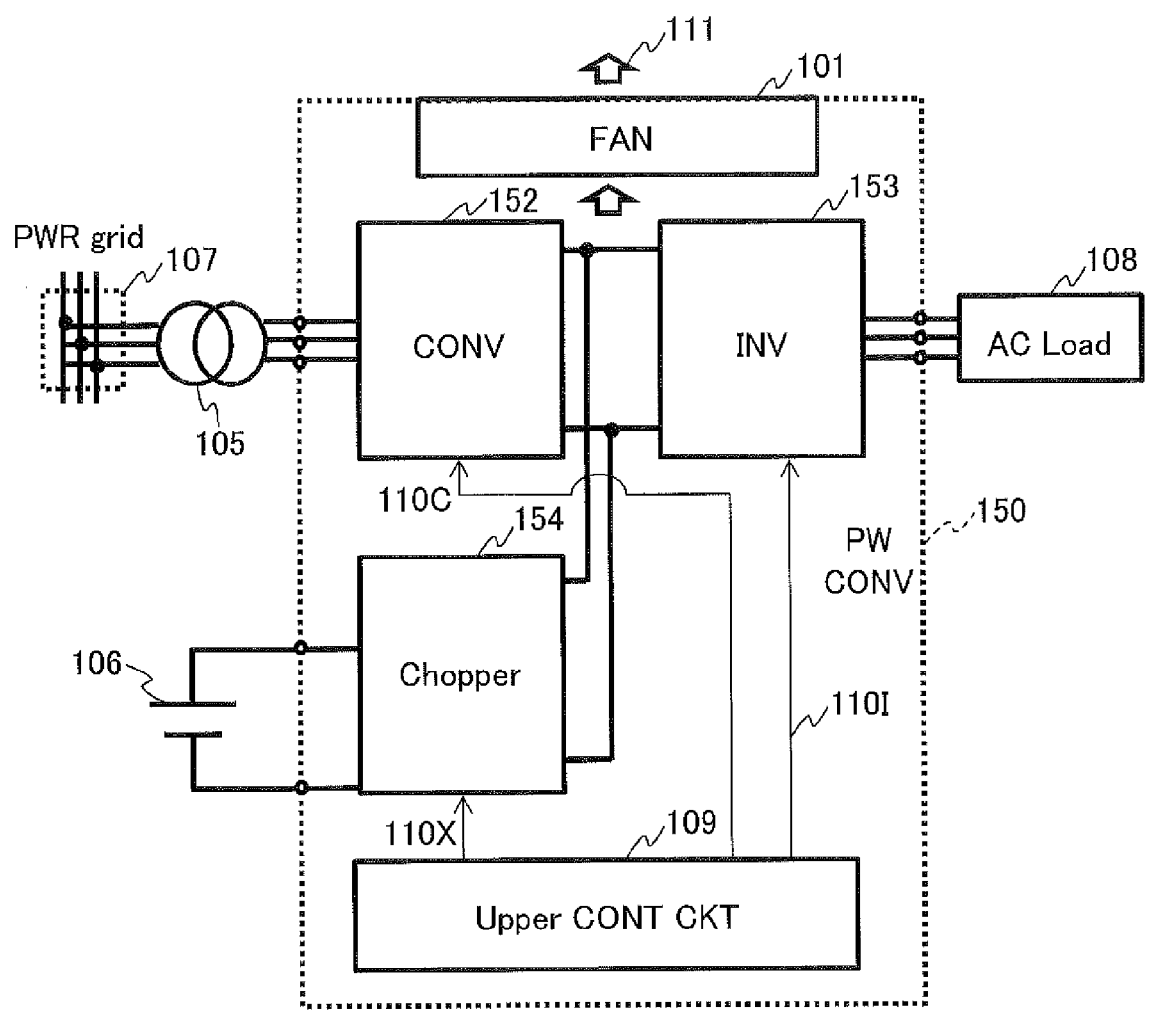
FIG. 17 is a schematic circuit diagram of the power converter according to the second embodiment.

FIG. 17 is a schematic circuit diagram of the power converter 150 according to the second embodiment. The power converter 150 is different from the power converter 100 in the first embodiment (see FIG. 1) in that a converter 152, an inverter 153, a chopper 154 are used in place of the converter 102, the inverter 103, and the chopper 104. Other parts are similarly configured.

In addition, a filter circuit may be disposed between the converter 152 and the transformer 105 or between the inverter 153 and the three-phase AC load 108.

Figure 18:
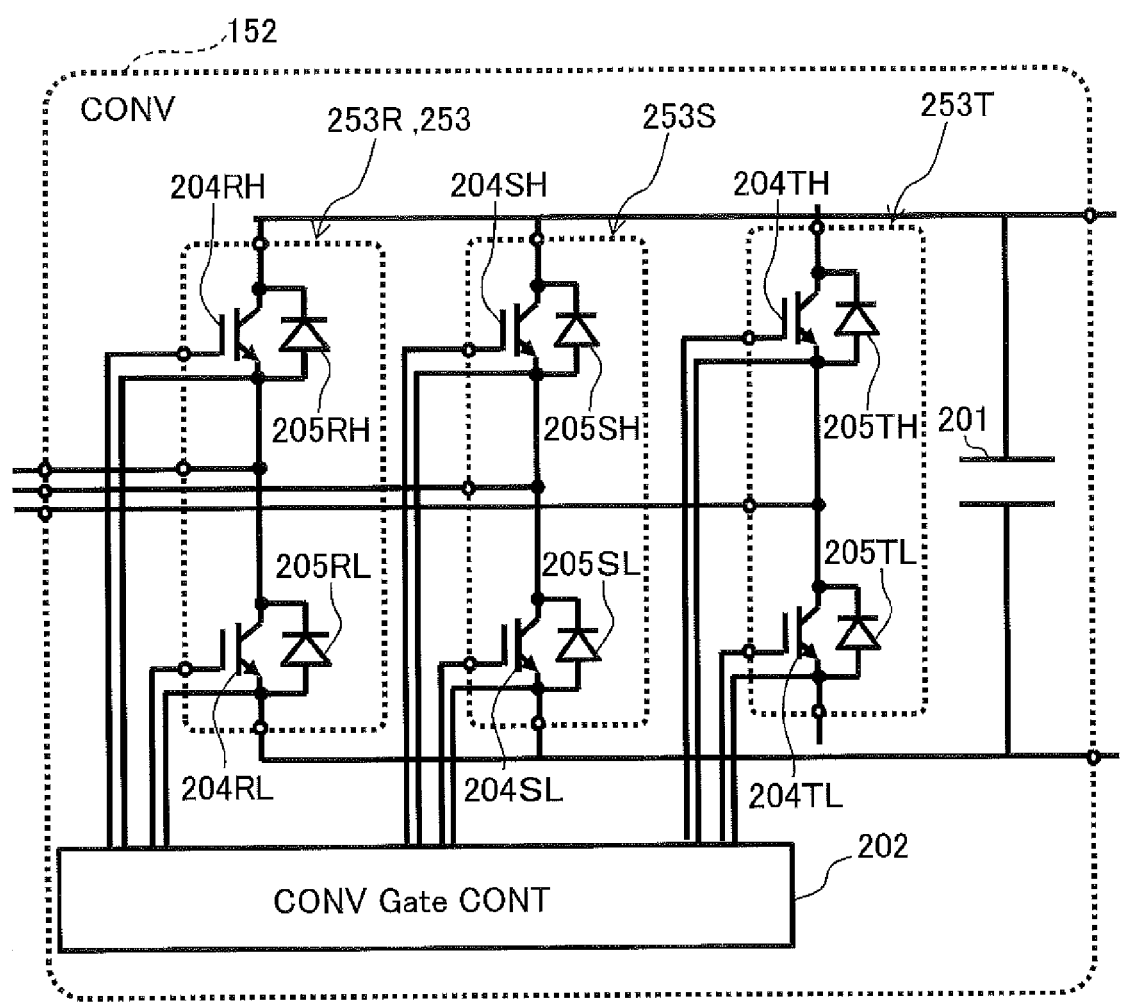
FIG. 18 is a schematic circuit diagram of the converter.
Figure 19:
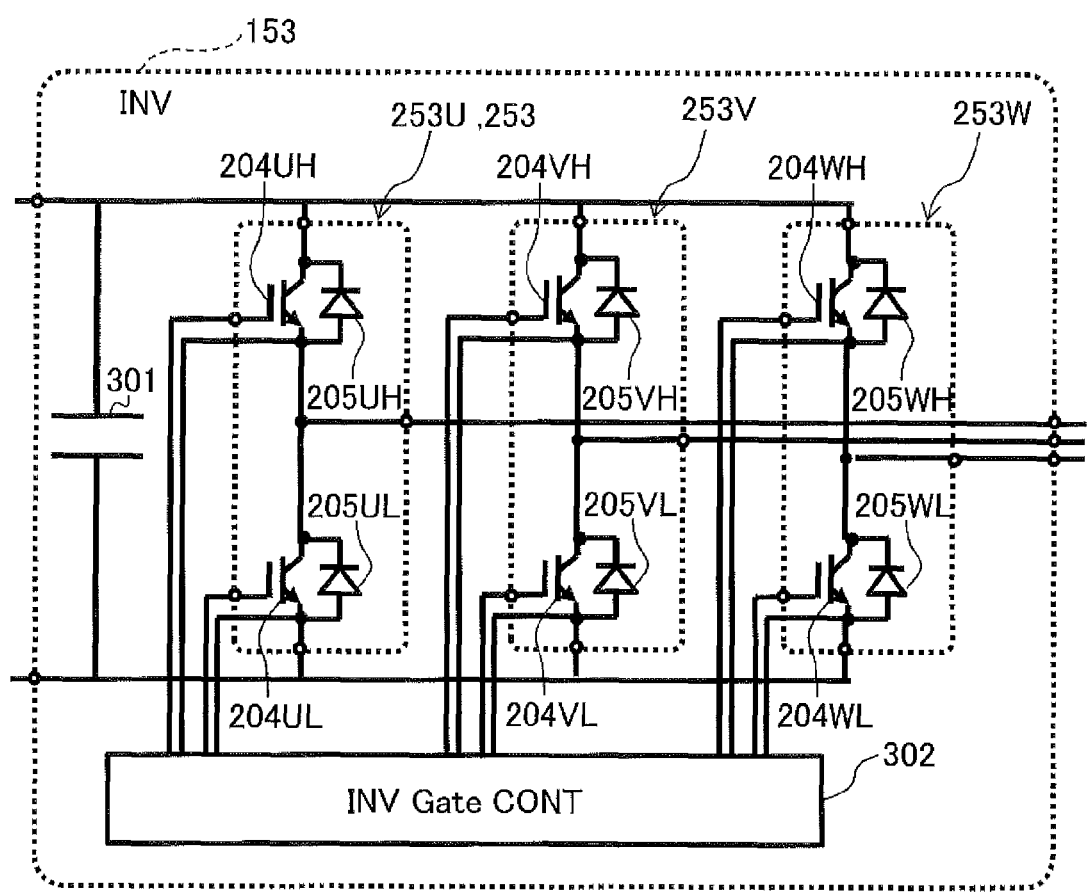
FIG. 19 is a schematic circuit diagram of the inverter.
Figure 20:
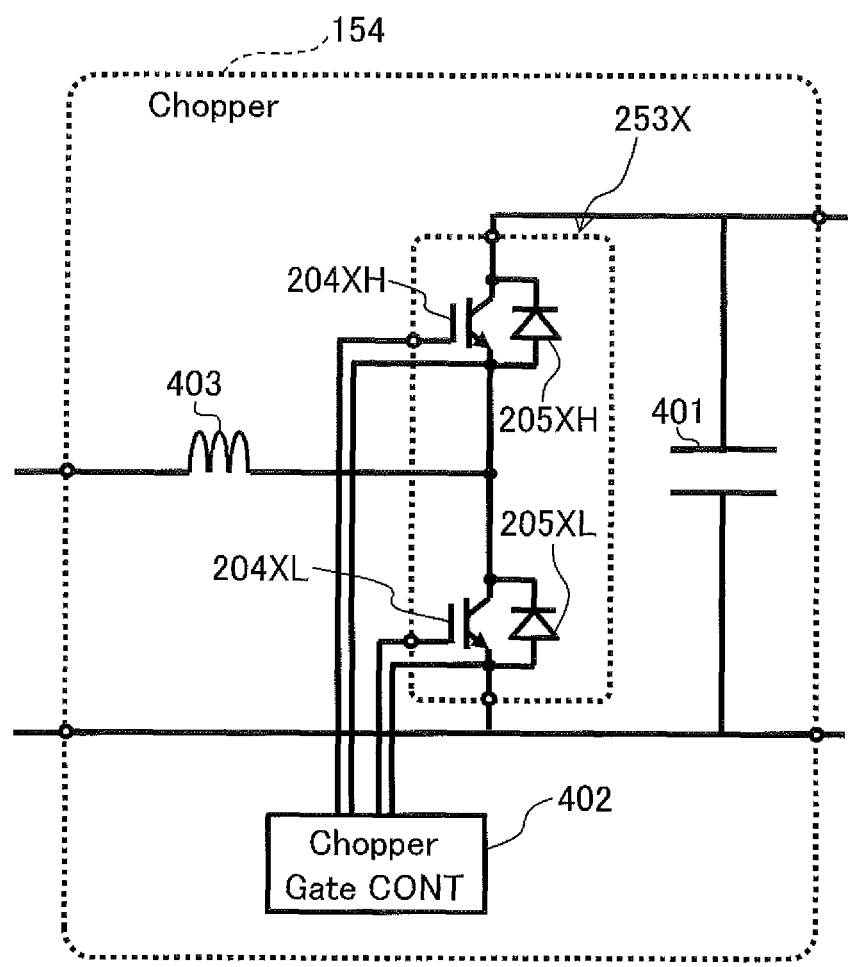
FIG. 20 is a schematic circuit diagram of the chopper.

FIG. 18 is a schematic circuit diagram of the converter 152. FIG. 19 is a schematic circuit diagram of the inverter 153. FIG. 20 is a schematic circuit diagram of the chopper 154. The converter 152, the inverter 153, and the chopper 154 have the same circuit structure as the converter 102, the inverter 103, and the chopper 104 (see FIGS. 2 to 4), respectively except that a leg 253 is used in place of the leg 203. The circuit structure of the leg 253 is similar to the leg 203. However, an exterior appearance of the leg 253 is different from that of the leg 203, and exterior appearances of the converter 152, the inverter 153, and the chopper 154 are different from those of the converter 102, the inverter 103, and the chopper 104 in the first embodiment, respectively. These differences are described later.

<Structure of Air-Cooling Type of Double-Sided-Cooling Power Unit 600>

Next, an air-cooling type of double-sided-cooling power unit 600 (heating body, a semiconductor unit for the power converter) used in the second embodiment is described with reference to the perspective view in FIG. 21A and a schematic circuit diagram in FIG. 21B. Each of the semiconductor devices is connected to configure the leg 253 (for example, see FIG. 18). Attached to an insulation body 753 are a P terminal 754P (DC positive terminal), an N terminal 754N (DC negative terminal), an AC terminal 754AC (AC terminal), and a gate terminal 751 for controlling switching between tuning-on and turning off.

Figure 21A:
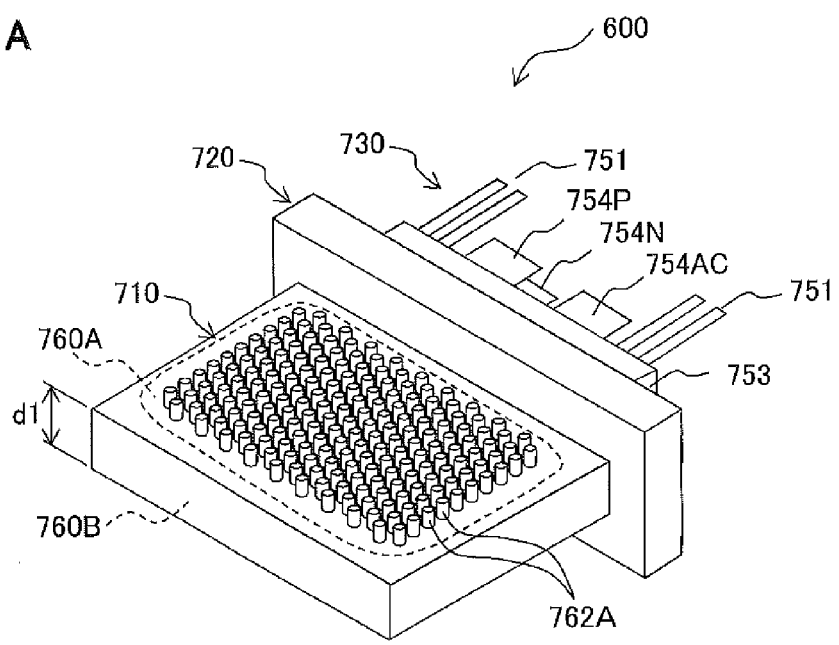
FIG. 21A is a perspective view of double-sided-cooling power module.
Figure 21B:
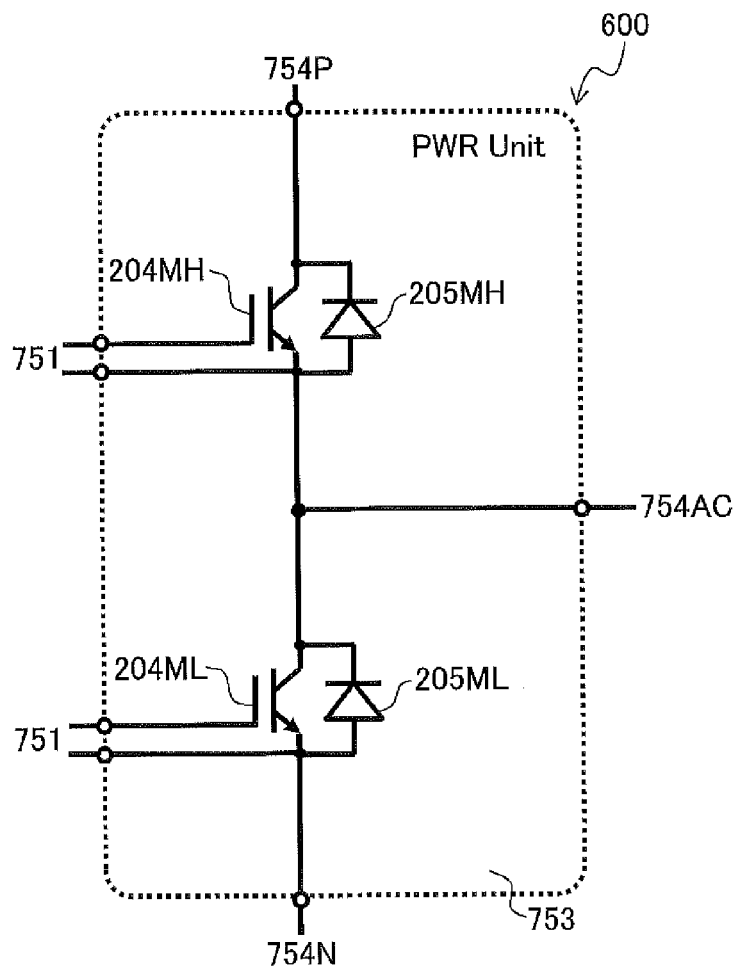
FIG. 21B is a circuit diagram the double-sided-cooling power module.

Next, in FIG. 21A, the air-cooling type of double-sided-cooling power unit 600 includes a cooling body 710 having a substantially rectangular parallelepiped, a flange 720, and on the flange 720, a terminal part 730 having a plurality of terminals extending from a surface opposite to the cooling body 710. The terminals in the terminal part 730 includes the P terminal 754P, the N terminal 754N, the AC terminal 754AC, and the gate terminal 751 which are shown in FIG. 21B.

Protruding from a one surface 760A of the cooling body 710 are a lot of (a total is not smaller than 200) pin fins 762 each having a small column shape. Further, formed on the other surface 760B opposite to the surface 760A are the same number of pin fins 762B (see FIG. 25). Hereinafter, the pin fins 762A and the pin fins 762B may be integrally referred to simply as "pin fin 762". The air-cooling type of double-sided-cooling power unit 600 is assumed to be cooled by a water cooling system. Accordingly, the terminal part 730 is directed upwardly and the cooling body 710 is directed downwardly, so that the cooling body 710 can be immersed into a cooling vessel to allow a coolant to flow between the pin fins 762. Accordingly, the surfaces 760A, 760B are called "cooling surface". It is assumed that a thickness of the cooling body 710, i.e., a distance between the surface 760A d the other surface 760B, is "d1".

When the semiconductor devices operate, electric connection to the external is provided via the terminal part 730. On the other hand, heat exhausting is provided via the surface 760A, 760B. More specifically, the terminal part 730 is formed on one of the side surface adjoining to the surfaces 760A, 760B and is electrically insulated from the surfaces 760A, 760B. Accordingly, the heat transfer path is independent from the electric paths.

<Mechanical Structure of Double-Sided-Cooling Power Unit>

Figure 22A:
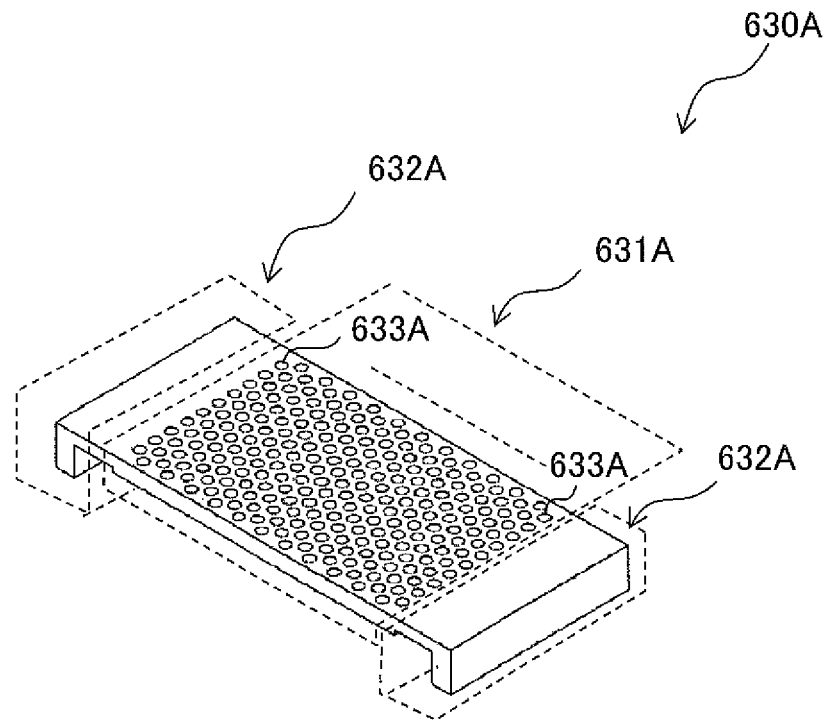
FIGS. 22A and 22B are perspective views of the heat receiving spacer.
Figure 22B:
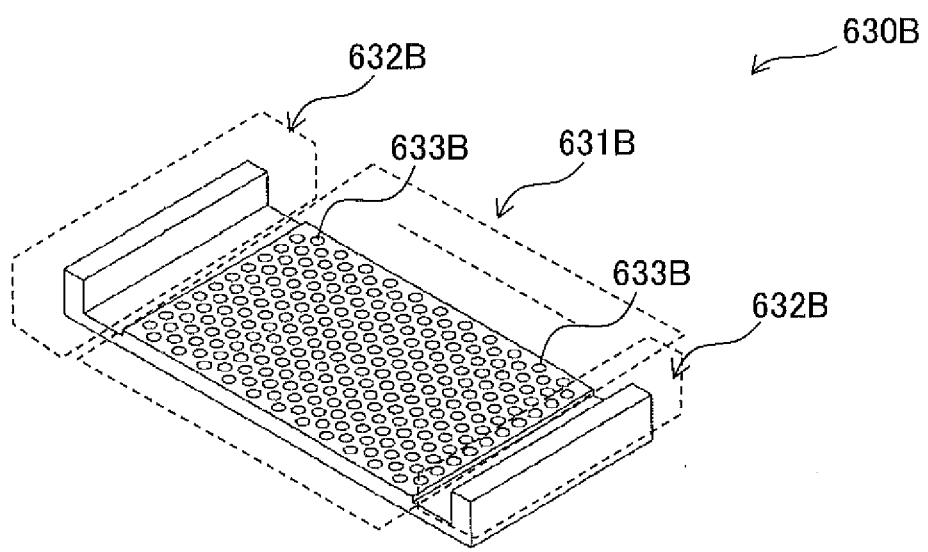

Attached to the surfaces 760A, 760B of the air-cooling type of double-sided-cooling power unit 600 are a pair of heat receiving spacers 630A, 630B shown in FIG. 22. The heat receiving spacer 630A includes a heat receiving part 631A (heat receiving plate) and a pair of space abutting parts 632A, having a substantially rectangular parallelepiped, protruding from the both ends of the heat receiving part 631A toward a heat receiving spacer 630B. Further, the heat receiving part 631A has a lot of loose through holes 633A having a circular column shape. These loose through holes 633A are formed at corresponding positions facing a cooling surface pin fins 762A on the surface 760A and have a diameter which is slightly greater than a diameter of the pin fins 762A. Essentially, it is ideal that the loose through holes 633A fit into the pin fins 762A tightly without any gap. However, there are slight errors caused during manufacturing regarding a diameter and a position of the pin fin 762A. Accordingly, a diameter of the through hole 633A is expanded to such an extent that the manufacturing error can be absorbed.

In addition, the heat receiving spacer 630B includes the heat receiving part 631B having a substantially rectangular parallelepiped shape and a space reserving part 632B having a substantially rectangular parallelepiped extends from both ends of a heat receiving part 631B having a substantially rectangular parallelepiped. The heat receiving spacer 630B has a symmetrical shape about the heat receiving spacer 630A. The heat receiving part 631B has loose through holes 633B at position corresponding to the pin fins 762 protruding from the other surface 760B of the air-cooling type of double-sided-cooling power unit 600, respectively.

Figure 25:
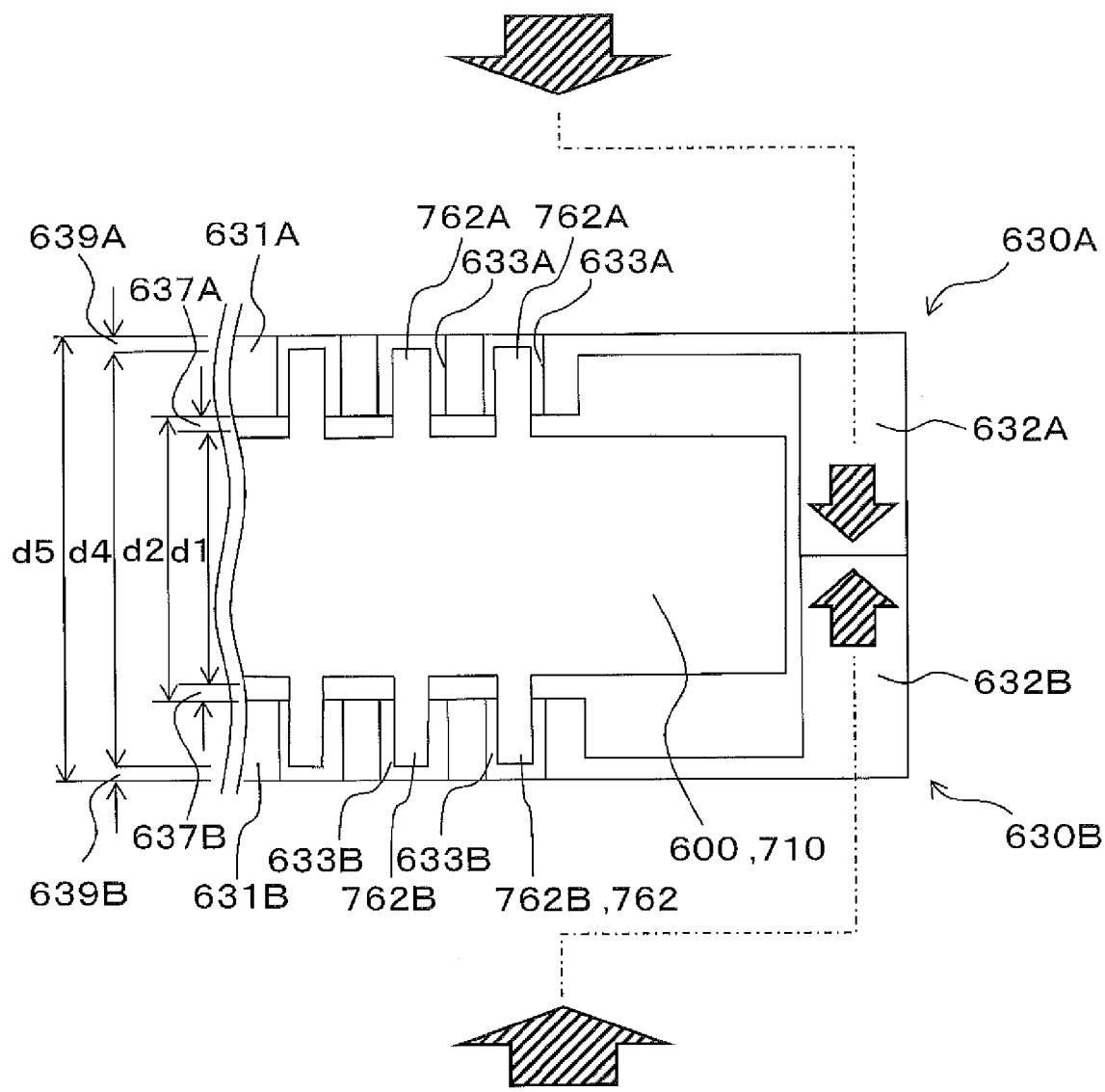
FIG. 25 shows a cross section taken along line A-A' in FIG. 23.

When the heat receiving spacers 630A, 630B are attached to the air-cooling type of double-sided-cooling power unit 600, the thermally conductive grease is sufficiently coated on the surface 760A, 760B, and the space reserving part 632A is abutted on the space reserving part 632B while the positions of the loose through hole 633A, 633B are aligned with the pin fins 762, respectively. FIG. 25 shows the state in which the heat receiving spacer 630A, 630B are attached, as described above, to the air-cooling type of double-sided-cooling power unit 600. As shown, an end surface 710a thereof of the cooling body 710 is exposed. However, large parts of the surfaces 760A, 760B are covered by the heat receiving spacers 630A, 630B.

Figure 23:
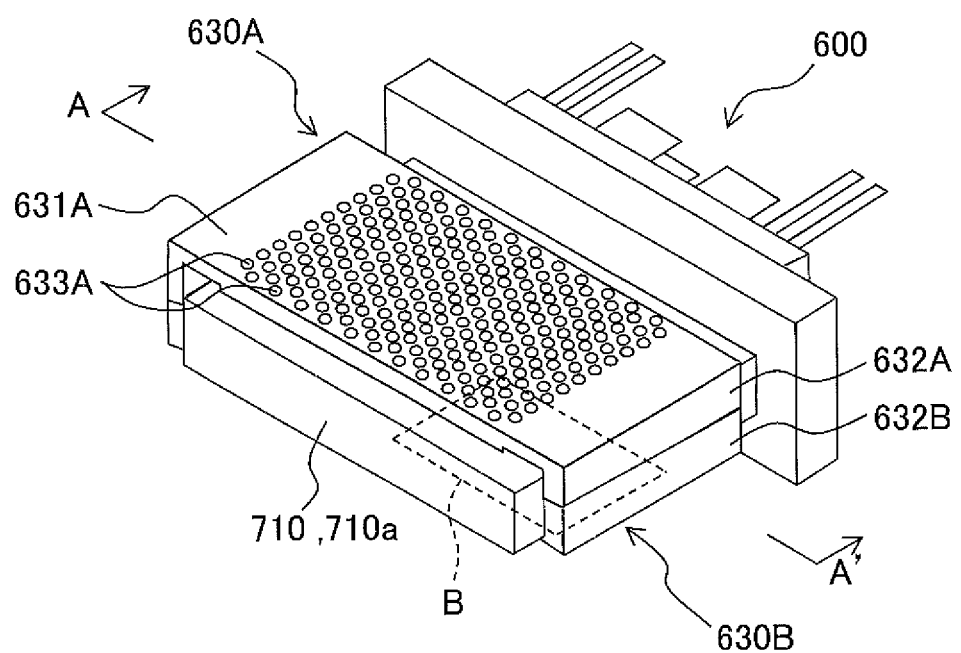
FIG. 23 is a perspective view illustrating a mounting state in which the heat receiving spacer is mounted.
Figure 24:
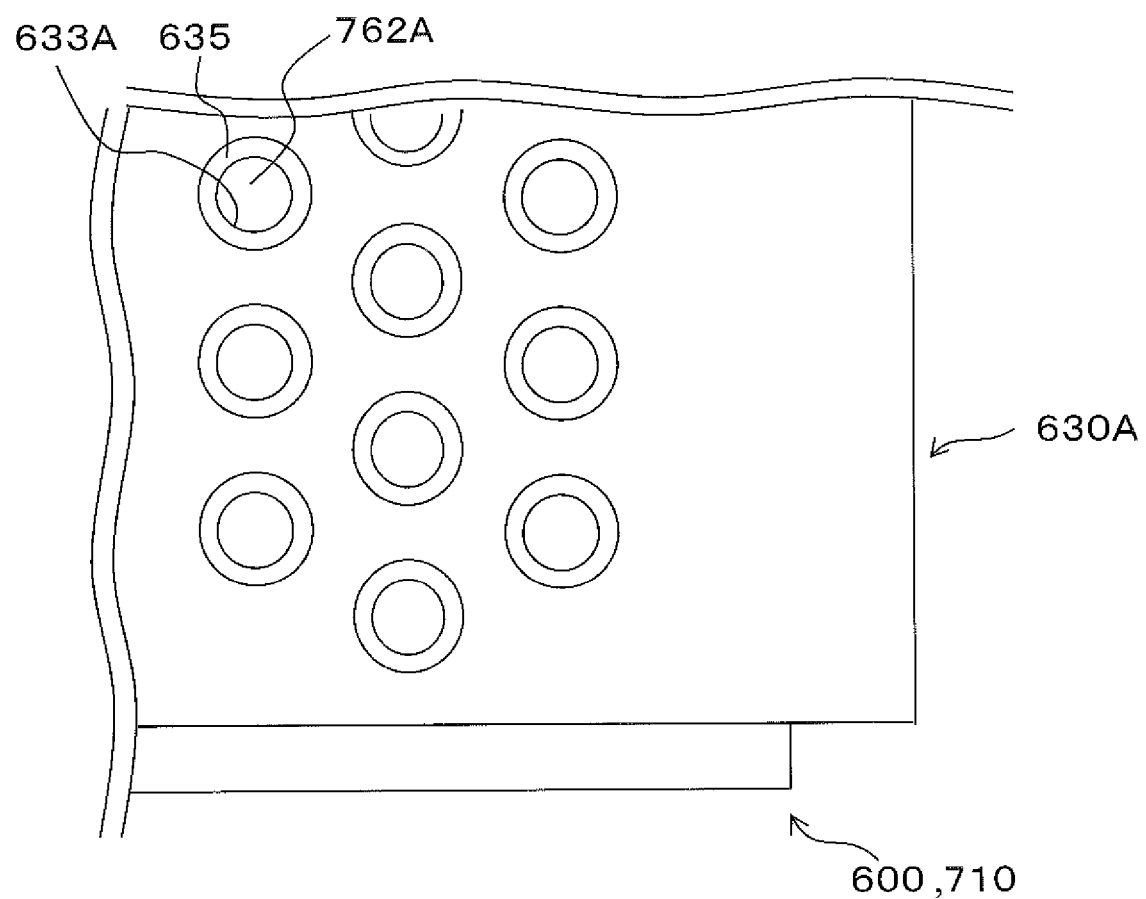
FIG. 24 is an enlarged view of a B part in FIG. 23.

An enlarged plan view of a part B in FIG. 23, which is enclosed with a broken line is shown in FIG. 24.

As described above, a diameter of the loose through hole 633A is slightly greater than that of the pin fin 762A, so that the pin fin 762A is inserted into the gap 635 the pin fin 762A provide a gap 635 with the loose through hole 633A During this, the thermally conductive grease coated on the pin fin 762A is pushed into and penetrates into the gap 635, so that the gap 635 is filled with the thermally conductive grease.

FIG. 25 shows an enlarged view of a main part (end part) taken along line A-A' in FIG. 23. When the space reserving part 632A is abutted on the space reserving part 632B, the heat receiving part 631A faces the heat receiving part 631B through a predetermined distance. This distance is d2 (see FIG. 25). The heat receiving spacer 630A, 630B are formed so that a distance d2 is greater than a thickness d1 of the cooling body 710 of the air-cooling type of double-sided-cooling power unit 600. As the result, gaps 637A, 637B are formed between the heat receiving part 631A and the cooling body 710 and between the heat receiving part 631B and the cooling body 710. Because the air-cooling type of double-sided-cooling power unit 600 has play with the heat receiving spacer 630A, 630B, widths of the gap 637A 637B are not the same.

When the space reserving part 632A is abutted on the space reserving part 632B, the thermally conductive grease coated on the pin fin 762 is pushed and penetrates into the gap 637A, 837B, so that the gap 637A, 637B are also filled with the thermally conductive grease without generation of gaps.

If it is assumed that a thickness of the cooling body 710 including a tip of the pin fin 762A to the tip of the pin fin 762B is d4, and a width of the whole body when the heat receiving spacer 630A is abutted on the heat receiving spacer 630B is d5, the heat receiving spacers 630A, 630B are formed such that the width d5 is slightly greater than a thickness d4. Accordingly, gaps 639A, 639B are formed between the an upper surface of the heat receiving spacer 630A and the tip of the pin fin 762A, and between a lower surface of the heat receiving spacer 630B and the tip of the pin fin 762B. As described above, the air-cooling type of double-sided-cooling power unit 600 has play on the heat receiving spacers 630A, 630B, so that widths of the gap 637A, 637B are not the same.

When the heat receiving spacer 630A, 630B are attached to a cooling device 610 (details are described later), a pressure force as shown by an arrow with hatching is applied. The pressure force is applied to the abutting part between the space reserving part 632A, 632B. In this embodiment, the gaps 637A, 637B are formed between the cooling body 710 and the heat receiving spacers 630A, 630B and the gaps 639A, 639B are formed at tips of the pin fins 762A, 762B. This prevents that the pressure force is applied to the cooling body 710. This can previously prevents the air-cooling type of double-sided-cooling power unit 600 from being defected.

Figure 26:
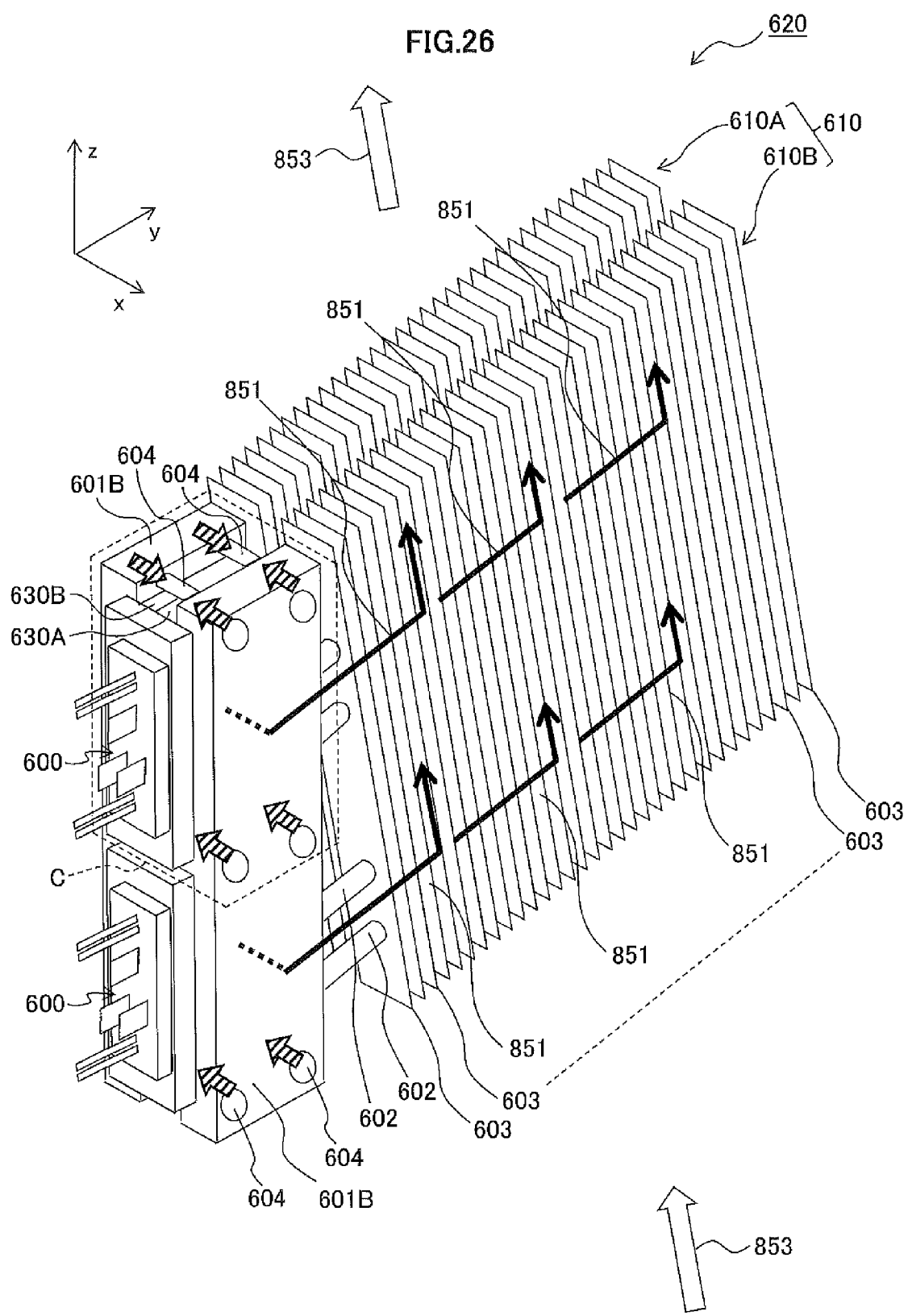
FIG. 26 shows a perspective view of the air-cooling type of double-sided-cooling power unit according to the second embodiment.

Next, FIG. 26 shows a perspective view in which the air-cooling type of double-sided-cooling power unit 600 is attached to the cooling device 610. The cooling device 610 includes a pair of cooling devices 610A, 610B. The cooling device 610A, 610B includes heat receiving blocks 601A, 601B, each being formed in a block in a substantially rectangular parallelepiped. The air-cooling type of double-sided-cooling power unit 600 is sandwiched.

The heat receiving blocks 601A, 601B are fastened by a plurality of fixing members 604 each other. The pressure forces indicated with hatched arrows are applied to the heat receiving blocks 601A, 601B. However, as described with reference to FIG. 25, the pressure force is applied to the heat receiving spacers 630A, 630B, but not applied to the air-cooling type of double-sided-cooling power unit 600. Further, as the fixing member 604, well-known bolts and nuts are usable.

In FIG. 26, four heat pipes 602 protrude in a y-axis direction from the heat receiving block 601A with inclination of about 10 degrees from the xy plane (horizontal plane) defined by the X, y axes. Further, a plurality of a heat radiation fins 603 having plate shapes are welded thereon in a radial direction of the heat pipe 602. Accordingly, the heat radiation fins 603 are inclined from the xz plane (vertical plane) defined by the x axis and the z axis. A cooling device 610B is also configured similarly to the cooling device 610A. As described above, the two air-cooling type of double-sided-cooling power units 600 are attached to the cooling device 610, so that the air-cooling type of double-sided-cooling power unit 620 is configured.

When the air-cooling type of double-sided-cooling power unit 600 generates heat, the heat is transferred to the heat receiving blocks 601A, 601B and further transferred to a rear part (in a direction of y-axis) by the heat pipe 602. When a cooling wind 853 is applied to the air-cooling type of double-sided-cooling power unit 620 so as to flow upwardly (in the z-axis direction) from a lower part of the air-cooling type of double-sided-cooling power unit 620, the cooling wind 853 cools the heat radiation fins 603 and passes there upwardly, so that the heat is rapidly exhausted. The heat transferring path is shown with arrows 851 in FIG. 26. Further, heat transferring in a direction orthogonal with the cooling wind 853 is mainly generated by the heat pipe 602.

Figure 27:
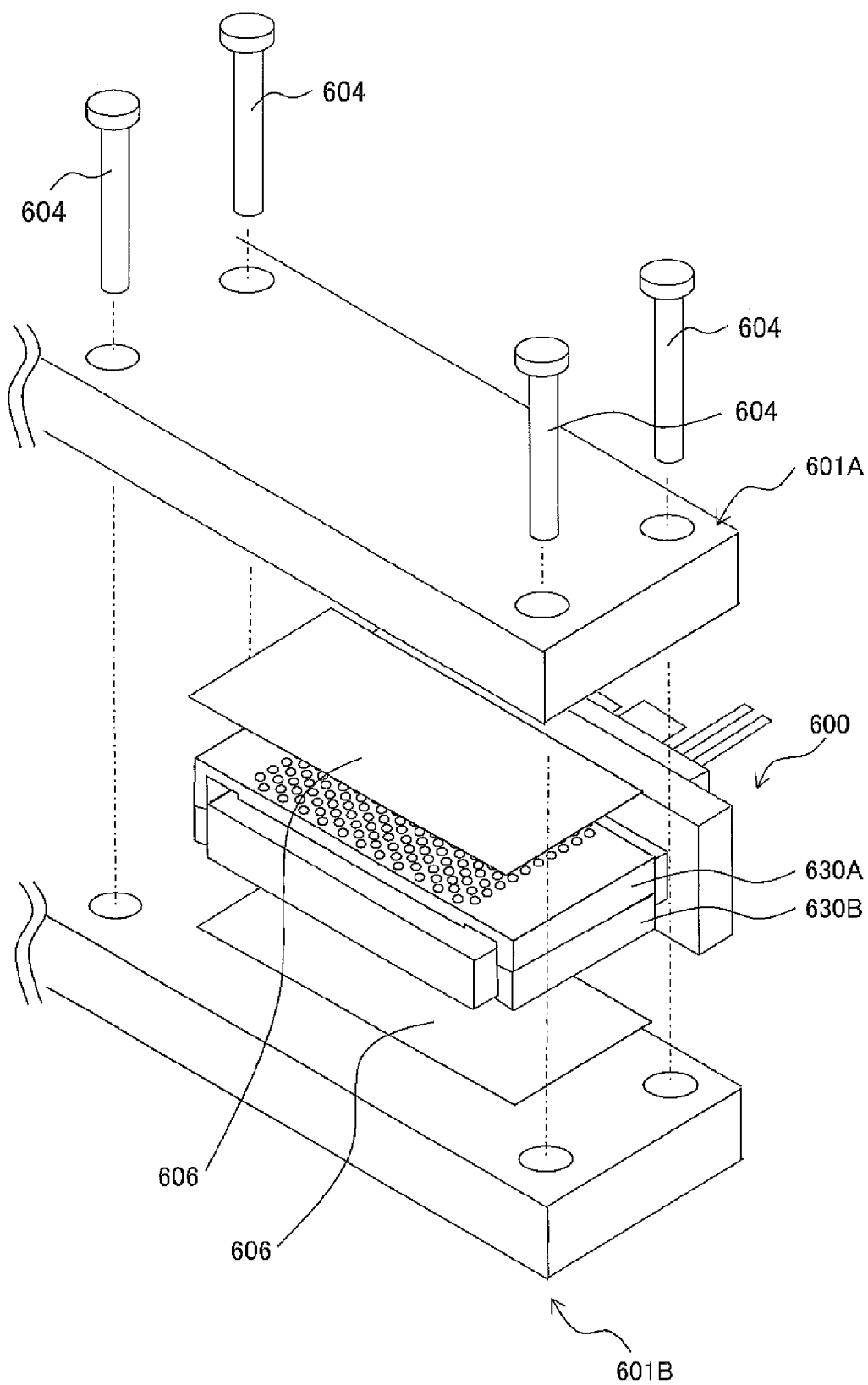
FIG. 27 is a perspective view of a C part in FIG. 26.

In FIG. 26, an exploded view of the region C encircled with a broken line is shown in FIG. 27.

In FIG. 27, the a conductive grease 606 is coated between the heat receiving spacer 630A and the heat receiving block 601A and between the heat receiving spacer 630B and the heat receiving spacer 630B, respectively. When the heat receiving block 601A, 601B are fastened with the fixing members 604, the thermally conductive grease 606 spreads along confronting surfaces between the heat receiving spacer 630A and the heat receiving block 601A and surfaces between the heat receiving spacer 630B and a heat receiving block 601B so as to be in a thin film state. During this, the thermally conductive grease 606 also penetrates into the gaps 639A, 639B (see FIG. 25) and penetrates on outer surface of the pin fins 762A, 762B without any gap.

<Structure of a Single Converter Unit 960>

Figure 28:
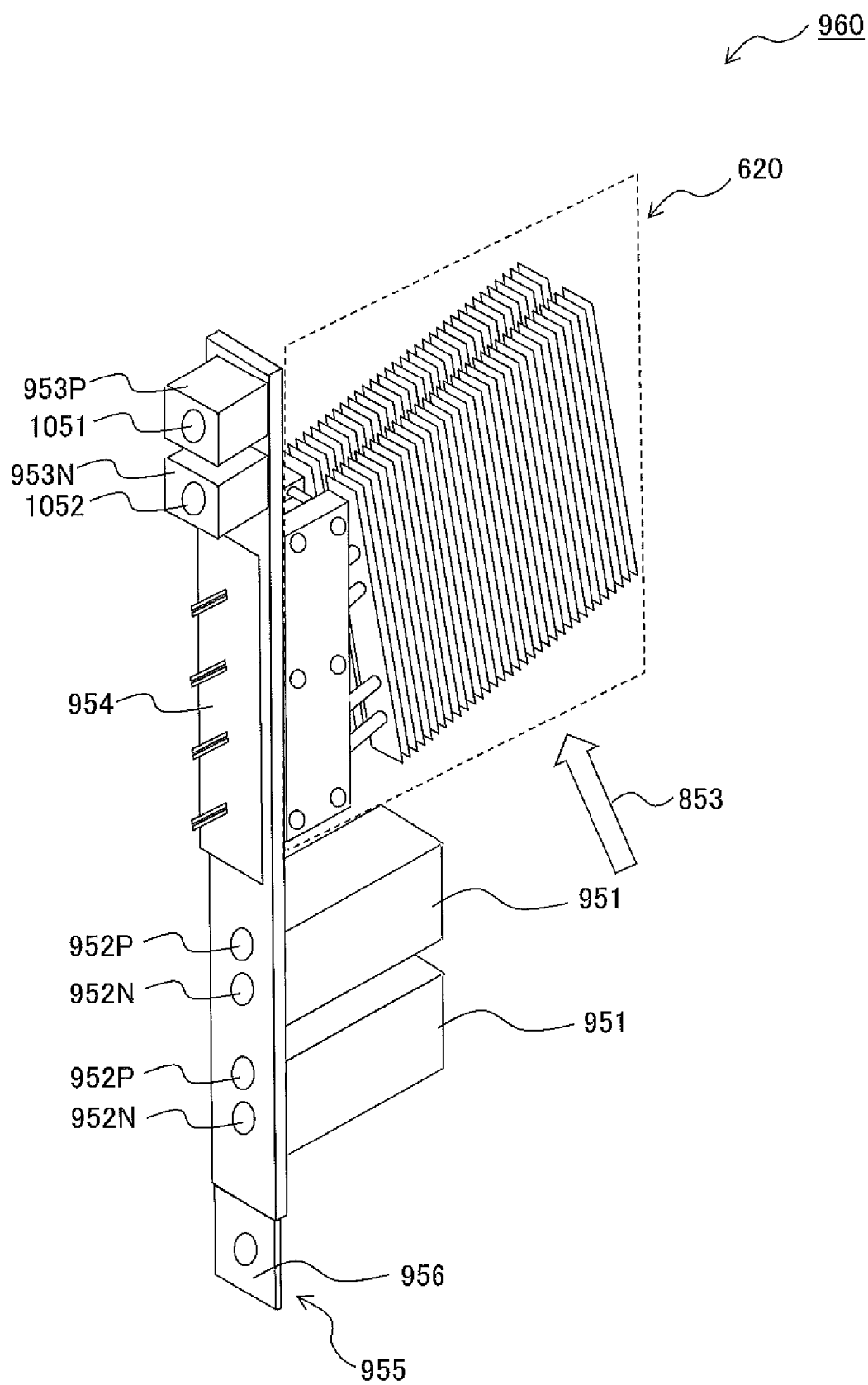
FIG. 28 is a perspective view of the single converter unit.
Figure 29:
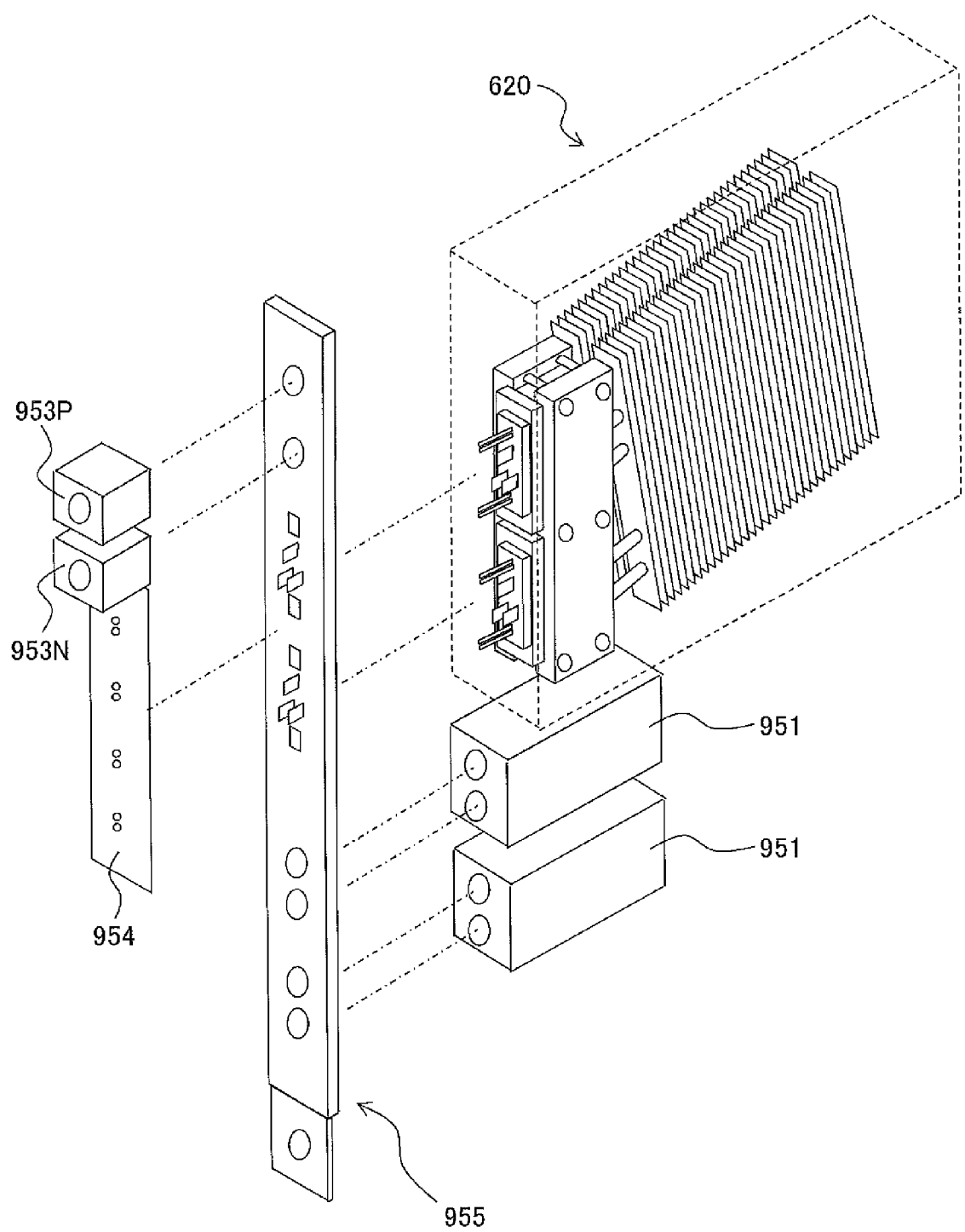
FIG. 29 is an exploded view of the single converter unit.
Figure 30:
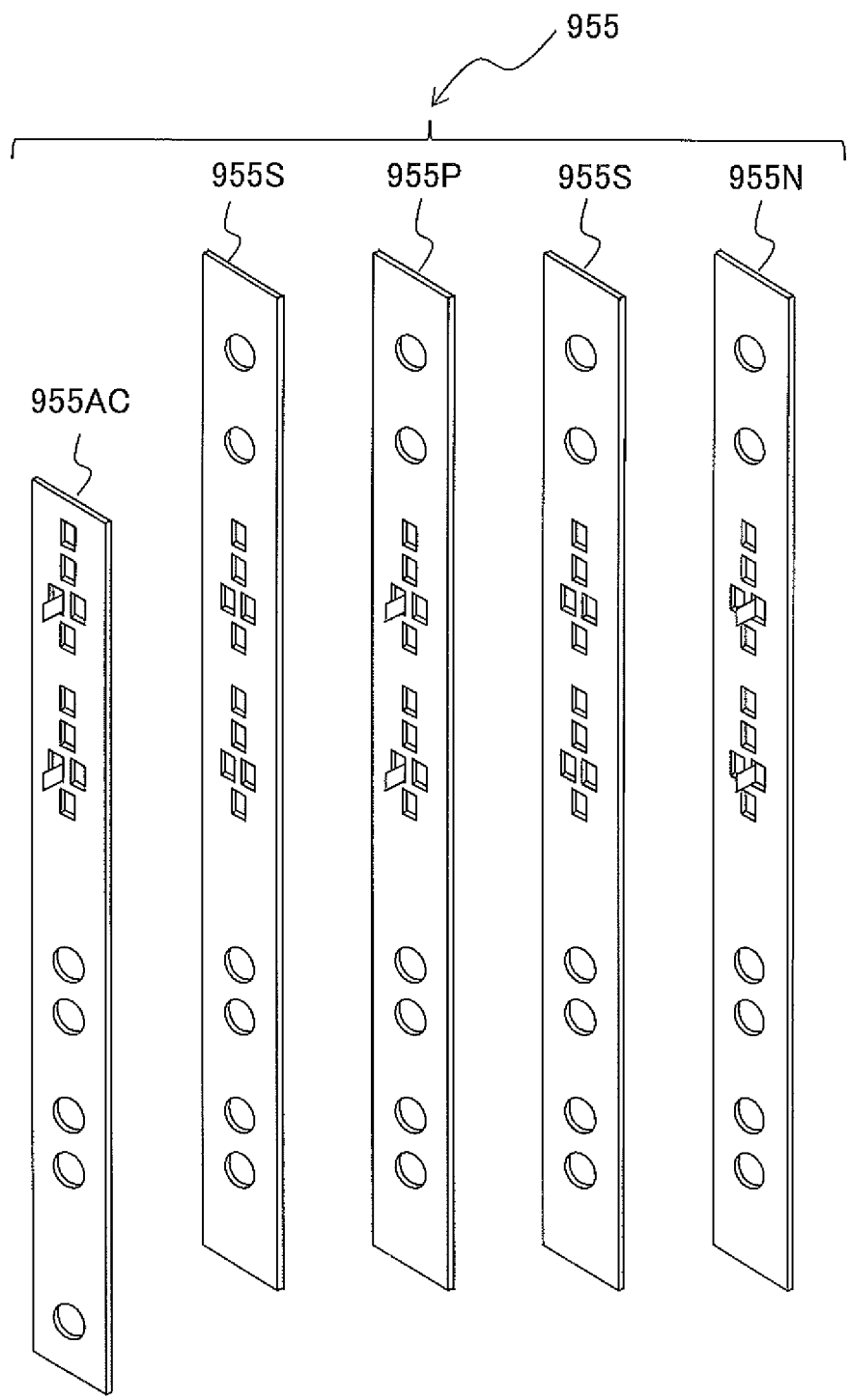
FIG. 30 is an exploded view of a laminated bus bar.
Figure 31:
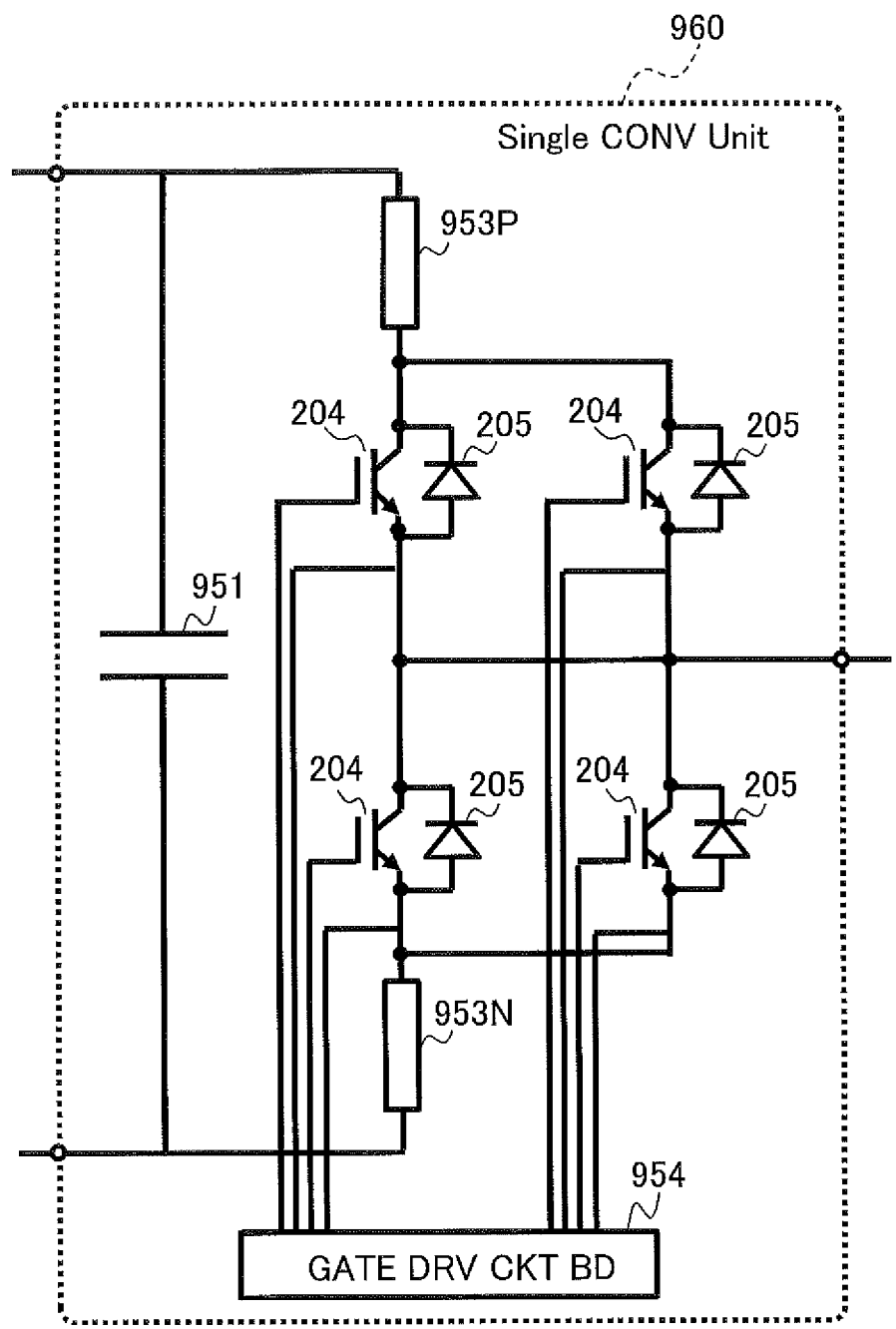
FIG. 31 is a schematic circuit diagram of the single converter unit.

Next the single converter unit 960 in the first embodiment is described with reference to FIGS. 28 to 31. FIG. 28 is a perspective view of the single converter unit 960. FIG. 29 is an exploded view of the single converter unit 960. FIG. 30 is an exploded view of a P·N·AC laminated bus bar 955. FIG. 31 is a schematic circuit diagram of the single converter unit 960.

In the single converter unit 960 shown in FIG. 28, the P terminal 754P (see FIG. 21), the N terminal 754N, and the AC terminal 754AC, being electric terminals of the air-cooling type of double-sided-cooling power unit 620 described above, are connected to the P layer, the N layer, and the AC layer of the P·N·AC laminated bus bar 955, respectively. Further, the gate terminal 751 of an electric terminal is connected to a gate driver circuit board 954. Further, positive terminals 952P and negative terminals 952 of a plurality of capacitors 951 are connected to the P layer and the N layer of the P·N·AC laminated bus bar 955, respectively. In addition, positive fuses 953P and negative fuses 953N are connected to the P layer and the N layer of the P·N·AC laminated bus bar 955, respectively. The positive fuse 953P and the negative fuse 953N have functions for cutting off the circuits to protect devices which an over current flows therethrough. If such a protection function is unnecessary, it is possible to omit the fuses.

FIG. 29 is an exploded view of FIG. 28. FIG. 30 is an exploded view of the P·N·AC laminated bus bar 955. As shown in FIG. 30, the P·N·AC laminated bus bar 955 includes a P layer bus bar 955P, the P layer bus bar 955P, an N layer bus bar 955N, an N·AC layer bus bar 955C. In the single converter unit 960, the P terminal 754P, the N terminal 754N, the AC terminal 754AC are connected to the P layer bus bar 955P, the N layer bus bar 955N, and an AC bus bar 955AC, and the AC bus bar 955AC, respectively. Further, the P terminal and the N terminal of the capacitor 951 are connected to the P layer bus bar 955P and the N layer bus bar 955N, respectively. The configuration in a circuit diagram described above is as shown in FIG. 31.

<Exterior Configuration of the Power Converter>

Figure 32:
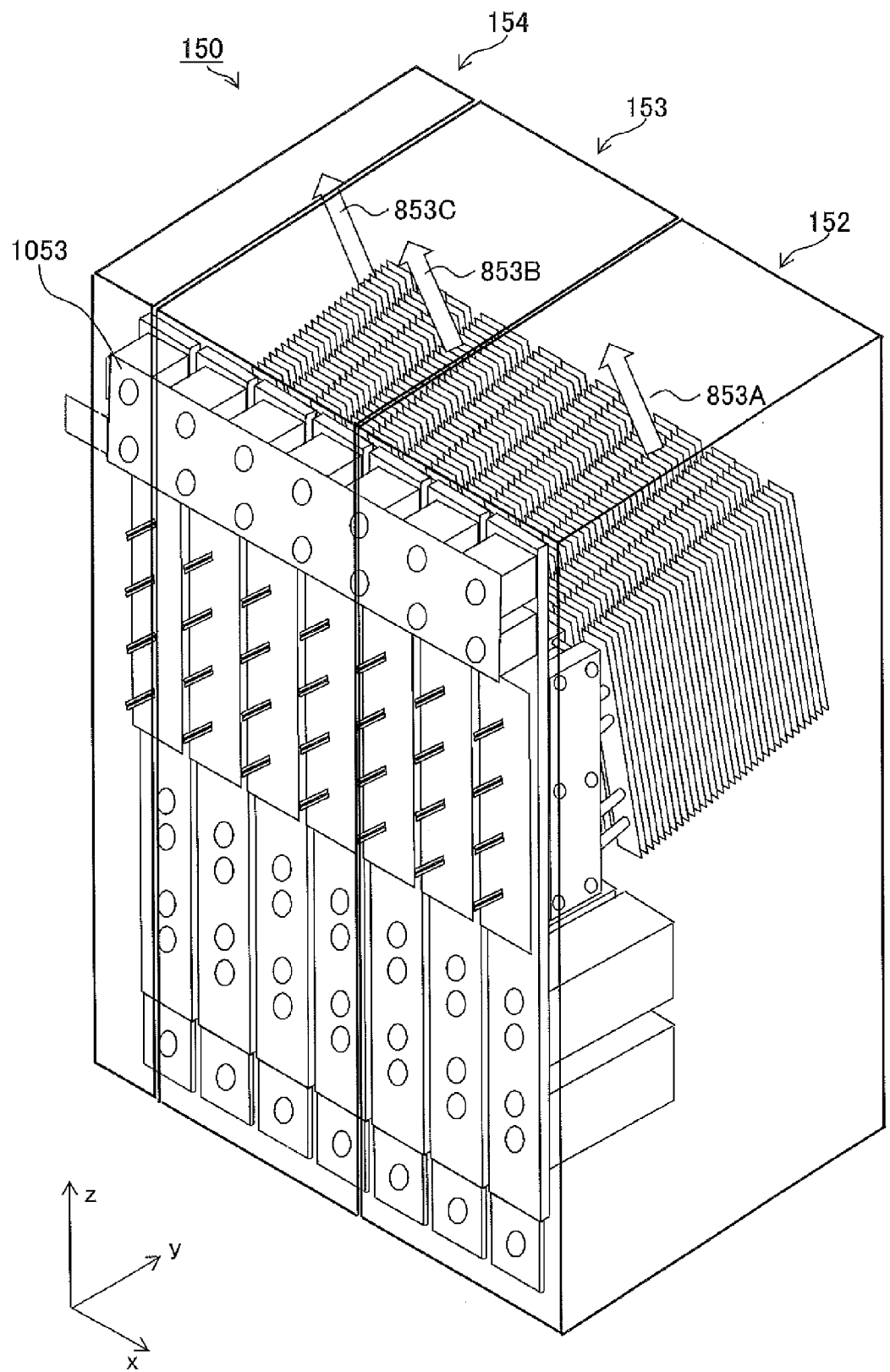
FIG. 32 is a perspective view of the power converter in which a plurality of the single converter units are arranged.

FIG. 32 is a perspective view of the power converter 150 in which a plurality of the single converter units 960 are arranged.

Inside the power converter 150, the converter 152, the inverter 153, and the chopper 154 are arranged laterally. The converter 152 includes the single converter units 960 corresponding to the three legs 253R, 253S, and 253T shown in FIG. 18. The inverter 153 includes the single converter units 960 corresponding to the three legs 253U, 253V, and 253W, as shown in FIG. 19. The chopper 154 includes the one single converter unit 960. However, the converter 152, the inverter 153, the chopper 154 can be arranged in an order which is different from the embodiment of the present invention, and the converters 152, the inverters 153, and the choppers 154 may be arranged thereamong in a different phase order.

As described in FIG. 26, in the air-cooling type of double-sided-cooling power unit 620 in the second embodiment, the heat generated by the air-cooling type of double-sided-cooling power unit 600 is transferred to a rear side (in the y direction) with the heat pipe 602 and exhausted through the heat radiation fins 603 provided at a rear part. In the structure shown in FIG. 32, a plurality of the single converter units 960 in which the air-cooling type of double-sided-cooling power units 620 are installed are arranged in a lateral direction, so that maintainability can be increased. When any one of the single converter units 960 is troubled, generally, the unit in traveling is drawn out from the power converter 150 and a spare unit is inserted. During this, drawing out the traveled unit and inserting a spare unit can be provided by moving these units simply in the y direction, so that a rapid maintain ace operation can be provided.

Figure 33:
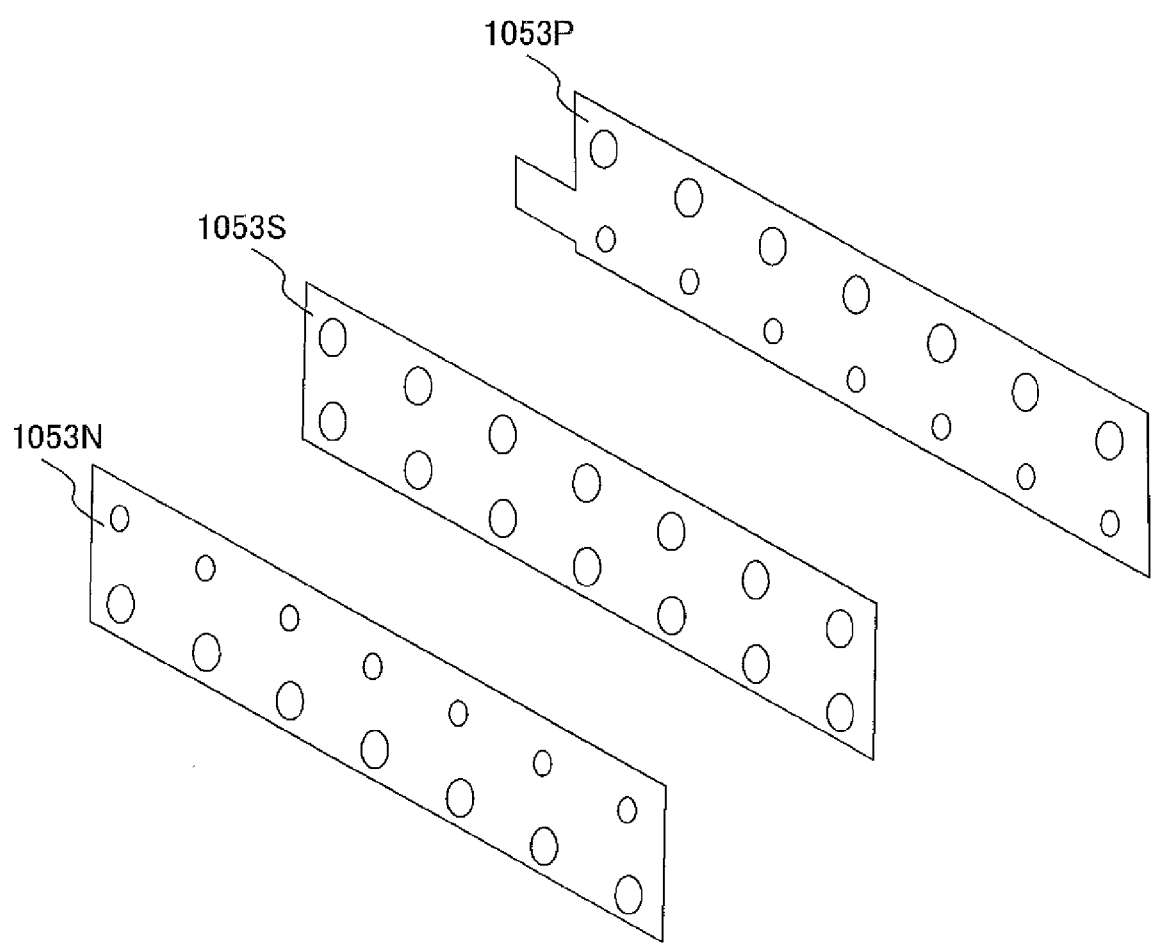
FIG. 33 is an exploded view of an interphase laminated bus bar.

The converter 152 is configured by connecting the three single converter units 960 by connecting the P·N interphase lamination bus bar 1053 to corresponding positive terminals 1051 and negative terminals 1052. The inverter 153 and the converter 152 are similarly configured. Because the chopper 154 includes the one single converter unit 960, it is not always necessary that the chopper 154 is connected to the P·N interphase lamination bus bar 1053. However, if a capacity of the chopper 154 is increased or in a case where the converter 152 and the inverter 153 are configured as an integrated system as describe in the second embodiment, it is desirable to connect the converter 152 and the inverter 153 at the same time. The P·N interphase lamination bus bar 1053 includes, as shown in FIG. 33, an interphase P bus bar 1053P and an interphase N bus bar 1053N, in which a insulating layer 105S provides insulation between respective bus bars.

In the converter 152, the inverter 153, and the chopper 154, it is also possible to connect a plurality of the single converter units 960 in parallel for each leg. Accordingly, the rated output capacity of the power converter can be increased.

In the cooling method of the single converter unit 960 in the power converter shown in FIG. 32, the cooling wind 853 is applied to the heat radiation fins 603 from a lower side to upper side. Accordingly, through the single converter unit 960s are arranged in the power converter 150 in lateral direction at a high density, the cooling efficiency between respective the single converter unit 960 cannot be decreased as an advantageous effect. In a case where temperatures of semiconductor devices in the converter 152, the inverter 153, and the chopper 154 are different, velocity of cooling winds 853A, 853B, 853C may be changed.

<Advantageous Effect>

As described above, according to the embodiments of the present invention provides a cooling structure including:

a heating element 600 having at least a cooling surface 760A, 760B including a plurality of protruded pin fins 762;

a heat receiving plate 631A, 631B having loose holes 633A, 633B into which the pin fins 762 are inserted at positions corresponding to the pin fins 762;

a cooling device 610 including pair of pinching members 601A, 601B configured to pinch the heating element 600 and the heat receiving plate 631A, 631B with a pressure force and cool the heat receiving plate 631A, 631B; and a space reserving part 632A, 632B, disposed on the heat receiving plate 631A, 631B, configured to control a gap (interval) in a pair of the pinching members 601A, 601B so as not to apply a pressure force by the pinching members 601A, 601B to the heating element 600.

Accordingly, the heat in the air-cooling type of double-sided-cooling power unit 600 can be transferred and cooled through the heat receiving parts 631A, 631B and the heat receiving blocks 601A, 601B.

In the second embodiment, the air-cooling type of double-sided-cooling power unit 600 as the heating element includes cooling surfaces 760A, 760B on two confronting surfaces. The heat receiving plates 631A, 631B have a shape corresponding to the cooling surfaces 760A, 760B and loose holes at positions corresponding to the pin fins 762. This provides transferring the heat from the double-sided cooling surfaces, so that the heat transferring effect can be further increased.

Further, in this embodiment thermally conductive grease 606 is coated between the pin fins 762 and a heat receiving plates 631A, 631B. Accordingly, a thermal resistance between the heating element and the heat receiving parts 631A, 631B can be reduced, so that the cooling device 610 can be down-sized.

In the second embodiment, the space reserving part 632A, 632B control the interval (d5+width of the thermally conductive grease 606) between a pair of pinching members (the heat receiving blocks 601A, 601B) is larger than a thickness d4 of the heating element including the pin fins 762. Accordingly, when the pinching members pinch the heating element, application of the pressure force to the pin fins 762 and defection of the heating elements is prevented.

Further, in the power converter 150, side surfaces of a plurality of semiconductor units for the power converter are arranged on the same plane, and a cooling wind is supplied by the cooling fan 101 to a plurality of heat radiation fins 603 from a rear side of the same plane. Accordingly, wiring between the air-cooling type of double-sided-cooling power unit 600 can be provided by the P·N interphase lamination bus bar 1053.

<Modifications>

The present invention is not limited to the above-described embodiments. For example, there are various modifications as follows.

Figure 34:
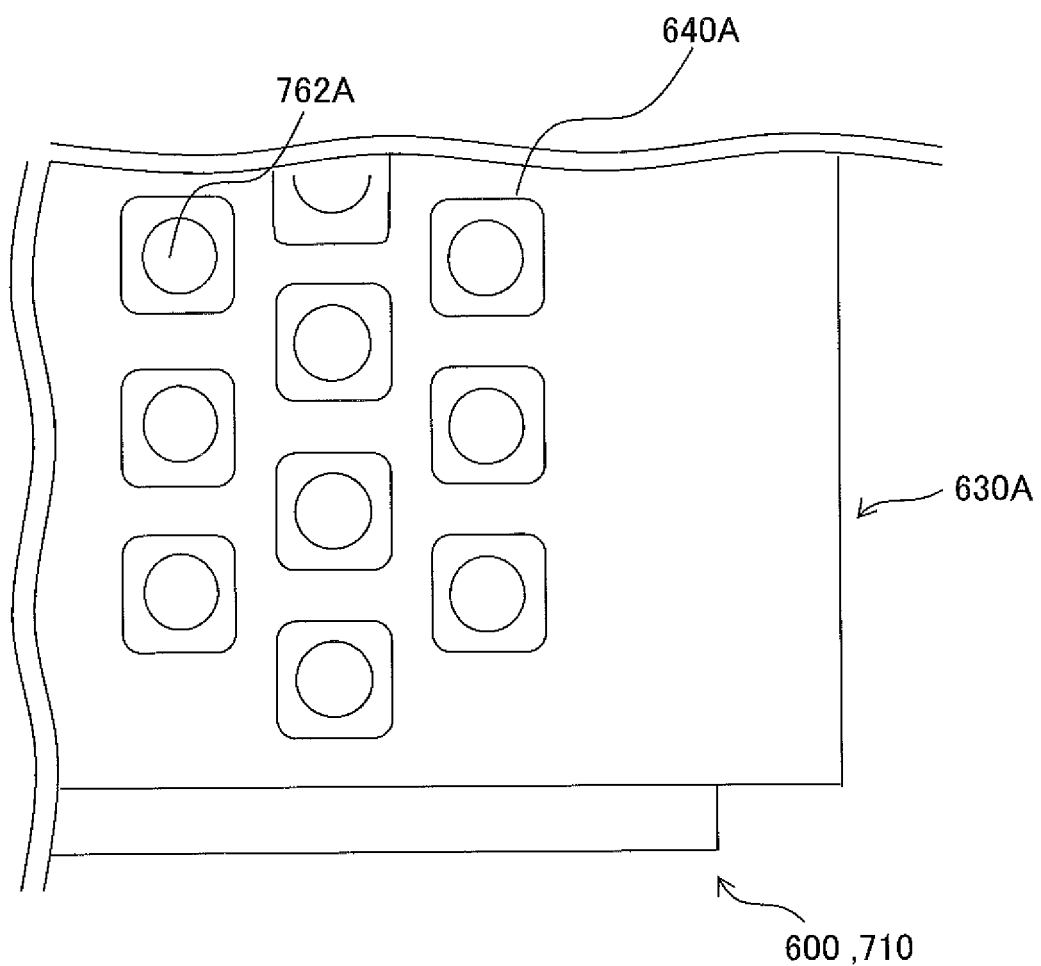
FIG. 34 is an enlarged view corresponding to a B part in FIG. 23 according to one modification of the heat receiving spacer.

(1) The loose through holes formed in the heat receiving spacer 630A, 630B are not limited to those described in the second embodiment. As long as the loose through hole can be inserted into the pin fin 762 with a gap therebetween, a pin fin loose through hole can be modified in various shapes and sizes. For example, as shown in FIG. 34, a loose through hole 640A having an opening of a rectangular shape may be formed at a position corresponding to the pin fin 762A. In this case, though a length of a side of the loose through hole 640A in the rectangular shape is equivalent to a diameter of the loose through hole 633A having a circle shape in the second embodiment as described above, an area of the loose through hole can be increased, so that there is an advantageous effect in that an operation for attaching the heat receiving spacer 630A to the air-cooling type of double-sided-cooling power unit 600 can be facilitated.

Figure 35:
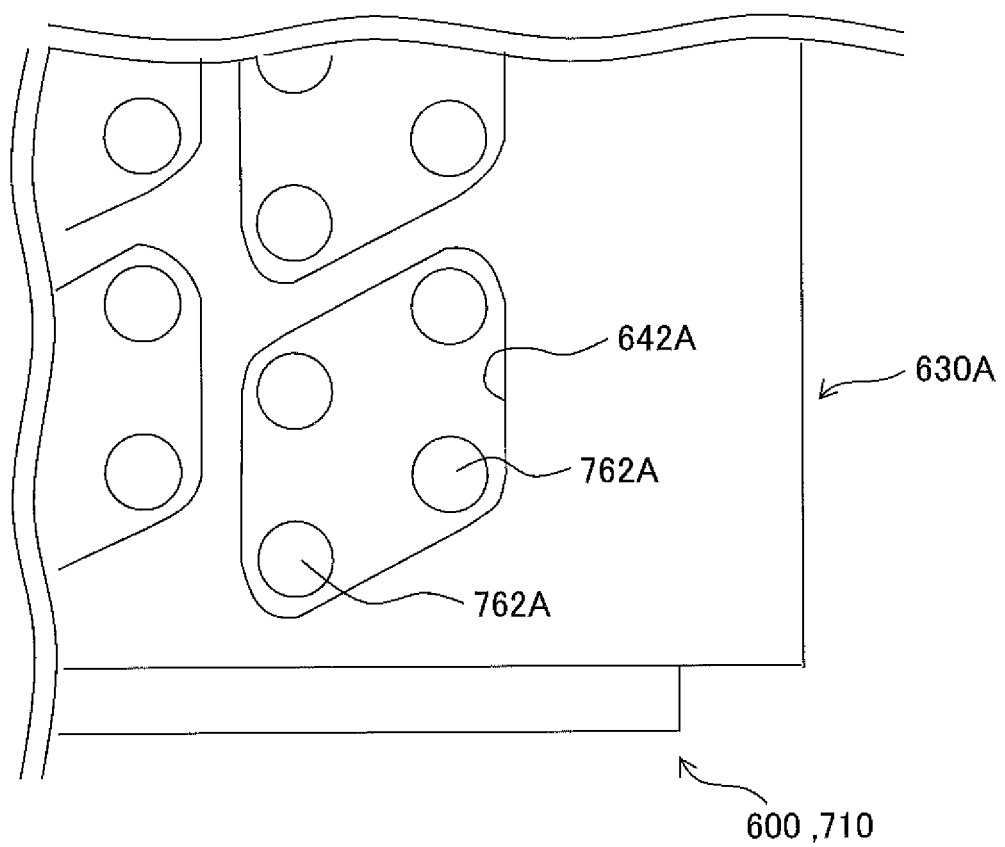
FIG. 35 is an enlarged view corresponding to the B part in FIG. 23 according to another modification of the heat receiving spacer.

(2) One loose through hole formed in the heat receiving spacer 630A, 630B is not limited to the loose through hole inserted into one pin fin 762. For example, as shown in FIG. 35, it is also possible to form a loose through hole 642A into which the four pin fins 762A can be loosely inserted. As described above, when the loose through hole 642A is formed so that a plurality of the pin fin 762 is inserted, the number of the loose through holes to be formed can be decreased. This looses an accuracy in size and decreases the manufacturing process. In the example in FIG. 35, the four pin fins 762A are inserted into the loose through holes 642A having a substantially parallelogram shape with a gap. However, the number of the pin fins 762 inserted into the two, three, or more than four loose through holes may be applicable. Accordingly, the shape of the loose through hole may be changed to a shape other than the substantially parallelogram.

Figure 36:
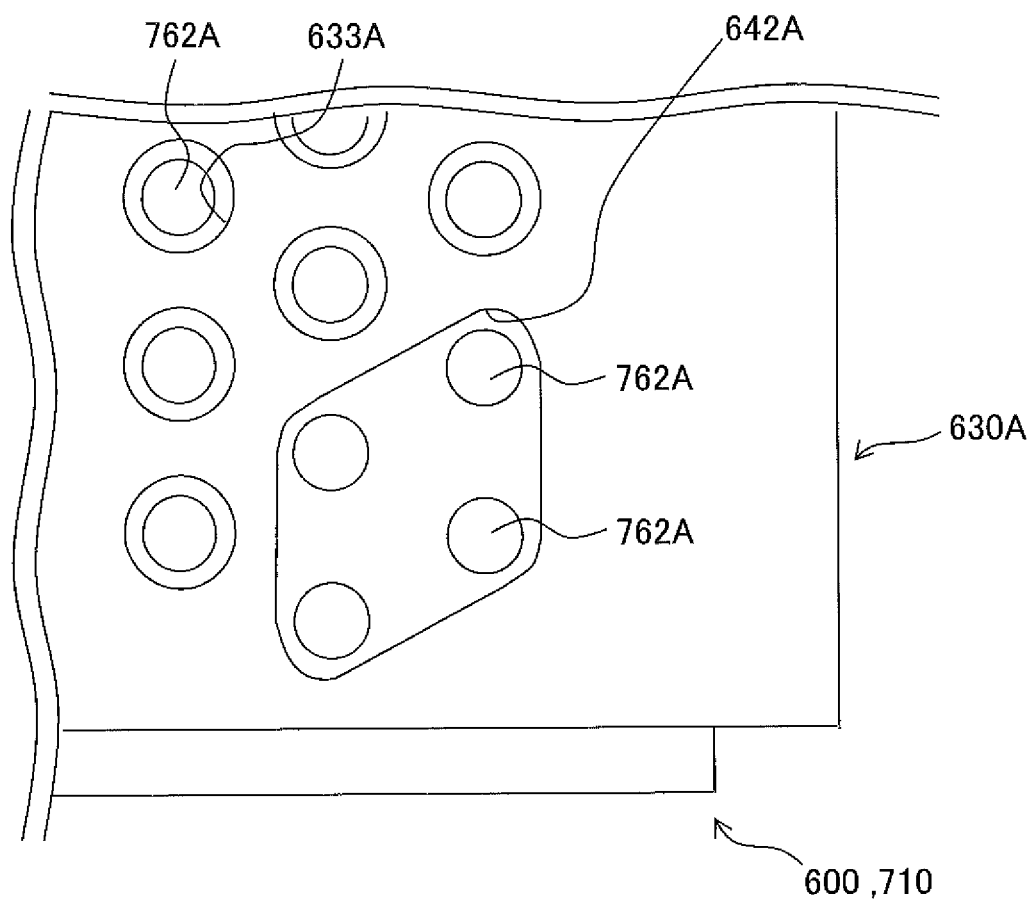
FIG. 36 is an enlarged view corresponding to the B part in FIG. 23 according to another modification of the heat receiving spacer.

(3) Shapes of the loose through holes formed in the heat receiving spacer 630A, 630B and the number of the pin fin 762 inserted into the loose through holes with gap may be changed in each region in the heat receiving spacer 630A, 630B. For example, as shown in FIG. 36, the four pin fins 762A inserted into loose through holes 642 and the loose through hole 633A into which the one pin fin 762A is inserted with a gap may be formed in the heat receiving spacer 630A. The former, i.e., loose through hole 642A, is more advantageous than the loose through hole 633A because the manufacturing process can be decreased. The latter, i.e., the loose through hole 633A is more advantageous than the loose through hole 642A in capability of decreasing the thermal resistance. Accordingly, in the region of which a heat radiation quantity is little in the air-cooling type of double-sided-cooling power unit 600, the loose through hole 642A allowing a plurality of the pin fins 762A to insert therethrough together is adopted. On the other hand, at a location having a larger quantity of heat radiation, the loose through hole 633A into which each of the pin fins 762 is inserted is adopted. This provides both a manufacturing easiness and a high heat performance.

Figure 37:
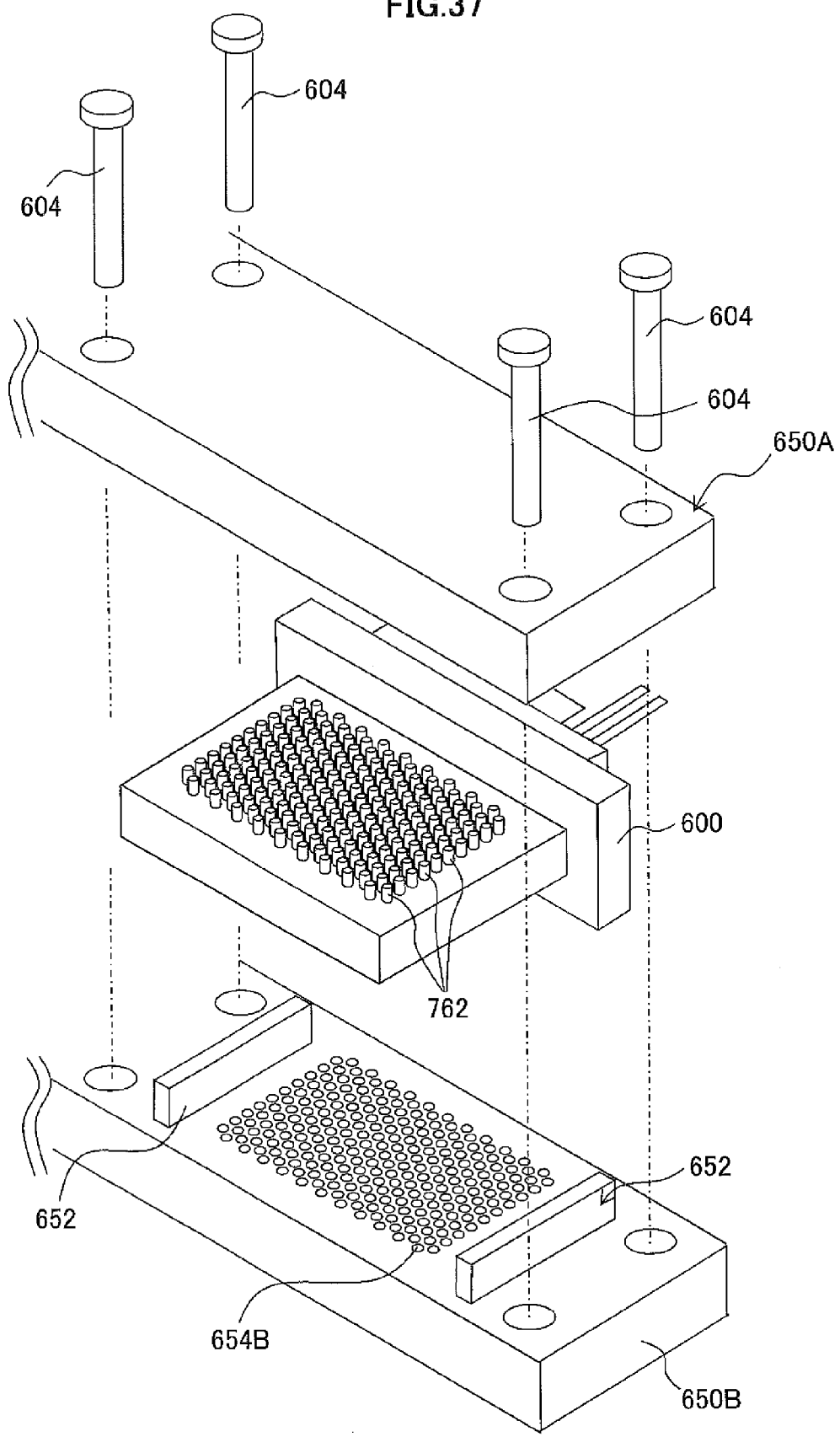
FIG. 37 is an exploded perspective view corresponding to a C part in FIG. 26 according to another modification of the heat receiving spacer.

(4) In the second embodiment described above, the heat receiving spacers 630A 630B are separated from the cooling devices 610A, 610B. However the heat receiving spacer can be formed integrally with the cooling device. For example, a heat receiving blocks 650A, 650B shown in FIG. 37 are applicable in place of the heat receiving block 601A, 601B and the heat receiving spacers 630A, 630B. In the heat receiving blocks 650B, a plurality of hollow parts 654B having a column shape are formed at locations corresponding to the pin fins 762 of the air-cooling type of double-sided-cooling power unit 600. Similarly, in the heat receiving block 650A, a plurality of hollow parts in a column shape are formed at locations corresponding to the pin fins 762.

Further, in the heat receiving block 650B, a pair of a space reserving part 652 having a rectangular parallelepiped are formed so as pinch the region where the hollow part 654B is formed. In the modification, at corresponding locations of the heat receiving block 650A, parts corresponding to the space reserving part 652 are not formed. The space reserving part 652 are formed to be lower than the thickness d4 (see FIG. 25) of the cooling body 710 including the pin fin 762 and slightly higher than the thickness d1 of the cooling body 710 except the pin fin 762 (see FIG. 25). Further, a depth of the hollow part 654B formed in the heat receiving block 650B and a depth of the hollow part (not shown) formed in the heat receiving block 650A are slightly deeper than a height of the pin fin 762. Accordingly, in FIG. 37, though the air-cooling type of double-sided-cooling power unit 600 is pinched between the heat receiving blocks 650A 650B and the heat receiving blocks 650A, 650B are fasten with the fixing members 604, a pressure force is not applied to the air-cooling type of double-sided-cooling power units 600.

In the modification of the present invention, it is possible to further suppress the heat resistance of the hole of the device because the heat receiving blocks 650A, 650B have the functions of the heat receiving spacers 630A, 630B and the heat receiving blocks 601A, 601B together. Further, the number of the components can be reduced, so that there are advantageous effects in that the manufacturing control can be easily provided. In addition, there is not always to form the space reserving part 652 in the modification together with the heat receiving block 650B but may be formed separately.

(5) In the second embodiment, the loose through holes 633A, 633B are formed in the heat receiving spacers 630A, 630B. However, in place of the loose through hole, it is also possible to form the hollow part similar to the hollow part 654B shown in FIG. 37. During the formation, the above-described configuration is allowed as long as the depth of the hollow part is deeper than the height of the pin fin 762.

(6) It is desirable that the heat receiving spacers 630A, 630B are formed with high heat transferring metal such as aluminum or copper in view of heat radiation. However, it is also possible to use a resin or ceramic as the heat receiving spacers 630A, 630B when it is necessary to insulate the air-cooling type of double-sided-cooling power unit 600 from the cooling device 610.

(7) In the second embodiment, an elastic member such as a rubber plate may be inserted into the abutting surfaces of the space abutting parts 632A, 632B. This enables a slight height adjustment and relaxation of the pressure force.

(8) In the second embodiment, the heat pipe 602 and the heat radiation fin 603 are used for the cooling devices 610A, 610B. However, it is also possible to use a cooling device in which a heat radiation fins are directly joined with the heat receiving blocks 601A, 601B. Further, a cooling device of a liquid cooling type in which a coolant is flow thereinside can be used.

Figure 38:
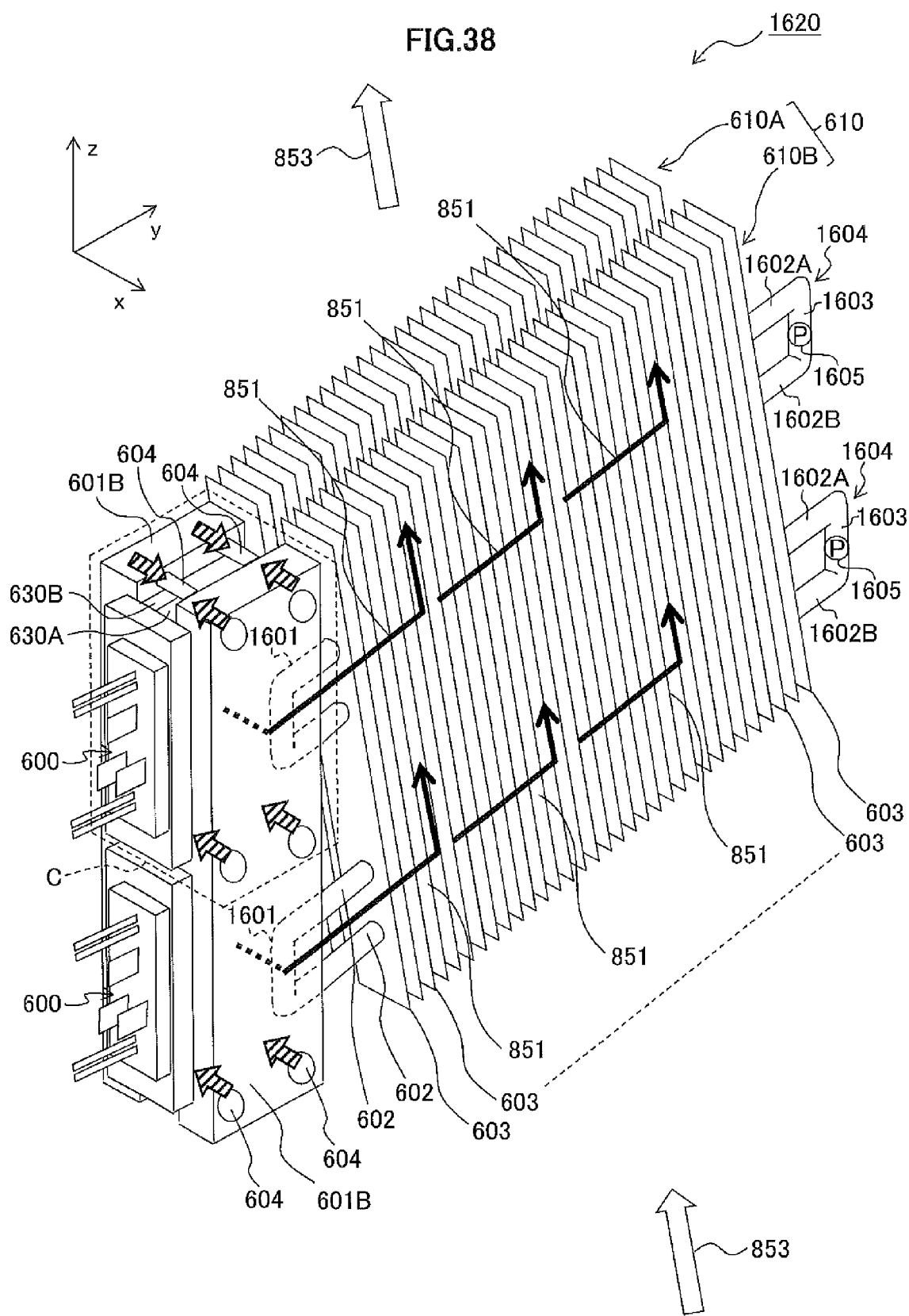
FIG. 38 is a perspective view of the liquid-cooling type of double-sided-cooling power unit according to a modification.

FIG. 38 shows an example of this structure as a modification. Flow channels 1601 are formed in the heat receiving block 601B. One end of a forward pipe 1602A is connected to one end of each of the flow channels 1601. On a side of the cooling device 610A opposite to the heat receiving block 601B the forward pipe 1602A is connected to one end of a return pipe 1603. The other end of the return pipe 1603 is connected to one end of the backward pipe 1602B. The other end of the backward pipe 1602B is connected to the other end of the flow channels 1601 to form a flow path 1604. The heat of the heating element is transferred to a liquid coolant (not shown) in the flow channel 1601 in the heat receiving block 601B. The liquid coolant flows and circulates through the flow path 1604, so that the heat in the liquid coolant is radiated by the heat radiation fins 603. The heat receiving block 601B has a pair of this structure. The heat receiving block 601A also has a pair of this structure. The air-cooling type of double-sided-cooling power unit 520 in the first embodiment also can have this structure.

(9) In the second embodiment, as the fixing member 604, the bolts and nuts are used. However, a spring may be used.

(10) In the second embodiment, a heat conductive sheet may be used in place of the thermally conductive grease 606.

(11) In the second embodiment, the surfaces 760A, 760B of the air-cooling type of double-sided-cooling power unit 600 are flat, and the heat receiving parts 631A, 631B are planer shapes. However, the surfaces 760A, 760B are not always flat. More specifically, the same advantageous effect similar to the above-described embodiment can be provided by equalizing the shapes of the heat receiving parts 631A, 631B to shapes extending along the surfaces 760A, 760B.

(12) In FIG. 26 of the second embodiment, the heat pipe 602 is inclined by about 10 degrees to the xy plane (horizontal plane), the heat pipe 602 may arranged horizontal without the inclination.

The invention claimed is:

1. A cooling structure comprising;
   a plurality of heating elements arranged in a vertical direction, each including cooling surfaces respectively disposed on two confronting side surfaces extending in the vertical direction, and an electric terminal on a side surface extending in the vertical direction and adjoining the two confronting side surfaces;
   a plurality of heat receiving blocks pinching the heating elements arranged in the vertical direction on the two confronting side surfaces;
   first and second cooling devices, each including a heat pipe including a plurality of heat radiation fins; and
   a pressure contacting part configured to contact the heating elements and the receiving blocks with a pressure force, wherein
   a wind is applied to the heat radiation fins;
   the heat radiation fins are disposed above the heating elements and extend in a horizontal direction;
   the wind is applied to the heat radiation fins from a side of the electric terminal; and
   the heat radiation fins of the first and second cooling devices extend in a horizontal direction, wherein heat radiation fins of the first and second cooling devices are disposed at different heights in the vertical direction and interlockingly arranged.

2. The cooling structure as claimed in claim 1, wherein the cooling surfaces are electrically insulated from the electric terminal of the heating element.

3. The cooling structure as claimed in claim 1, wherein the first and second cooling devices extend in the vertical direction, the cooling structure further comprising a gap between a pair of adjoining heat radiation fins of the first and second cooling devices at the same height in the vertical direction.

4. The cooling structure as claimed in claim 1, wherein the first and the second cooling devices comprises the heat radiation fins which are shared by heat pipes of the first and second cooling devices.

5. The cooling structure as claimed in claim 1, further comprising a waved stiffness buffering part, wherein a pair of adjoining heat radiation fins of the first and second cooling devices are connected with the waved stiffness buffering part.

6. A power converter comprising a plurality of the cooling structures which are arranged, each of the cooling structures being defined by claim 1, wherein the heating element comprises a semiconductor module for a power converter.

7. The power converter as claimed in claim 6, further comprising a blower blows the heat radiation fins from a side of the electric terminal in a housing.

8. The cooling structure as claimed in claim 1, wherein a plurality of the heat radiation fins are arranged behind the heating element.

9. The cooling structure as claimed in claim 8, wherein
   each of the cooling surfaces comprises a plurality of protruded pin fins, wherein each of the heat receiving blocks includes:
   a heat receiving plate having a shape corresponding to a shape of the cooling surface and holes into which the pin fins are loosely inserted, the cooling structure further comprising:
   a pair of pinching members configured to pinch the heating element and the heat receiving planes with a pressure force;
   a cooling device configured to cool the heat receiving plates, and
   a space reserving part configured to control a gap in a pair of the pinching members so as not to apply a pressure force by the pinching members to the heating element.

10. A cooling structure comprising:
    a heating element having at least a cooling surface including a plurality of protruded pin fins;
    a heat receiving plate having a shape corresponding to a shape of the cooling surface and loose holes into which the pin fins are inserted at positions corresponding to the pin fins;
    a cooling device including a pair of pinching members configured to pinch the heating element and the heat receiving plate with a pressure force and cool the heat receiving plate; and
    a space reserving part, disposed on the heat receiving plate, configured to control an interval in a pair of the pinching members so as not to apply a pressure force by the pinching members to the heating element.

11. The cooling structure as claimed in claim 10, wherein
    the heating element comprising cooling surfaces on two-confronting side surfaces thereof, and wherein
    the heat receiving plate includes a shape corresponding to the two-confronting cooling surfaces and the holes formed at locations corresponding to the pin fins protruding from the two surfaces.

12. The cooling structure as claimed in claim 10, further comprising thermally conductive grease coated between the pin fins and the heat receiving plate.

13. The cooling structure as claimed in claim 10, wherein the interval of the pinching member controlled by the space reserving part is larger than a thickness of the heating element including the pin fins.

14. The cooling structure as claimed in claim 10, wherein the hole has a circular column shape.

15. The cooling structure as claimed in claim 10, wherein a plurality of the pin fins are inserted into the holes.

16. The cooling structure as claimed in claim 10, wherein the heat receiving plate includes both a loose hole into which a plurality of the pin fins are inserted and a loose hole into which one of the pin fin is inserted.

17. The cooling structure as claimed in claim 10, further comprising:
heat radiation fins; and
a heat pipe connected to the pinching member and the heat radiation fins.

18. The cooling structure as claimed in claim 10, wherein the cooling device includes heat radiation fins connected to the pinching members.

19. The cooling structure as claimed in claim 10, further composing a flow path and a heat radiation fin connected the flow path.

20. A cooling structure comprising:
a heating element including at least a cooling surface including a plurality of pin fins;
a space reserving part formed to have a thickness smaller than a thickness of the heating element including the pin fins and larger than a thickness of the heating element without the pin fins;
a pair of pinching members, having a shape corresponding to a shape of the cooling surface, pinching the heating element sandwiched between the space reserving parts and holding the heating elements while a pressure force is applied to heating element.

21. A power converter comprising:
a plurality of the cooling structures as claimed in claim 10 arranged so as to adjoin each other, wherein the heating element comprising semiconductor unit for the power converter.

22. A power converter, comprising:
a plurality of semiconductor units for a power converter, each of the semiconductor units including cooling surfaces including a plurality of pin fines protruding from the cooling surfaces on confronting two-side surfaces thereof; and
an electric terminal on one of side surfaces adjoining the confronting two-side surfaces;
heat receiving plates, each including a shape corresponding to a shape of the cooling surface and lose holes into which the pin fins are inserted at locations corresponding to the pin fins, wherein the heat receiving plates are attached to the cooling surfaces, respectively;
a plurality of cooling devices, each including:
a plurality of pinching members configured to pinch the semiconductor units for the power converter and a plurality of heat receiving plates to hold the semiconductor units and the heat receiving plates with a pressure force;
a plurality of heat radiation fins, each extending in a horizontal direction relative to each of the semiconductor units; and
heat pipes connecting the pinching members to a plurality of heat radiation fines corresponding to the pinching members, respectively;
space reserving parts, disposed at the heat receiving plates, controlling an interval between the pinching members so as not to apply the pressure force by the pinching member to the semiconductor units, wherein
the side surfaces each having the electric terminal for the semiconductor unit for the power converter are arranged on the same plane; and wherein
a blower supplies a cooling wind to a plurality of the heat radiation fins on a rear side of the same plane.

* * * * *